US011088679B2

(12) United States Patent
Cohen et al.

(10) Patent No.: US 11,088,679 B2
(45) Date of Patent: Aug. 10, 2021

(54) SYNCHRONIZATION IN A QUANTUM CONTROLLER WITH MODULAR AND DYNAMIC PULSE GENERATION AND ROUTING

(71) Applicant: Quantum Machines, Tel Aviv (IL)

(72) Inventors: Yonatan Cohen, Tel Aviv (IL); Nissim Ofek, Tel Aviv (IL); Itamar Sivan, Tel Aviv (IL)

(73) Assignee: Quantum Machines

(*) Notice: Subject to any disclaimer, the term of this patent is extended or adjusted under 35 U.S.C. 154(b) by 0 days.

(21) Appl. No.: 16/861,527

(22) Filed: Apr. 29, 2020

(65) Prior Publication Data

US 2020/0287525 A1 Sep. 10, 2020

Related U.S. Application Data

(63) Continuation of application No. 16/666,461, filed on Oct. 29, 2019, now Pat. No. 10,666,238, which is a continuation of application No. 16/294,367, filed on Mar. 6, 2019, now Pat. No. 10,505,524.

(51) Int. Cl.
| G06F 13/36 | (2006.01) |
| H03K 3/38 | (2006.01) |
| G06N 10/00 | (2019.01) |
| H03K 19/195 | (2006.01) |

(52) U.S. Cl.
CPC .............. *H03K 3/38* (2013.01); *G06N 10/00* (2019.01); *H03K 19/195* (2013.01)

(58) Field of Classification Search
CPC ......... G06N 10/00; H03K 3/38; H03K 19/195
See application file for complete search history.

(56) References Cited

U.S. PATENT DOCUMENTS

| 6,993,108 B1 | 1/2006 | Chi et al. |
| 7,627,126 B1 | 12/2009 | Pikalo |
| 8,315,969 B2 | 11/2012 | Roetteler |
| 8,385,878 B2 | 2/2013 | Rao |
| 9,207,672 B2 | 12/2015 | Williams |
| 9,400,499 B2 | 7/2016 | Williams |
| 9,692,423 B2 | 6/2017 | McDermott, III |
| 9,847,121 B2 | 12/2017 | Frank |
| 9,858,531 B1 | 1/2018 | Monroe |

(Continued)

FOREIGN PATENT DOCUMENTS

| CN | 105912070 A | 8/2016 |
| CN | 108111306 A | 6/2018 |

(Continued)

OTHER PUBLICATIONS

U.S. Appl. No. 62/294,966, filed Feb. 12, 2016.

(Continued)

*Primary Examiner* — Kurtis R Bahr
(74) *Attorney, Agent, or Firm* — McAndrews, Held & Malloy, Ltd.

(57) ABSTRACT

A quantum controller comprises a first quantum control pulse generation circuit and a second quantum control pulse generation circuit. The first quantum control pulse generation circuit and a second quantum control pulse generation circuit are operable to operate asynchronously during some time intervals of a quantum algorithm and synchronously during other time intervals of the quantum algorithm.

19 Claims, 15 Drawing Sheets

(56) References Cited

U.S. PATENT DOCUMENTS

| | | | |
|---|---|---|---|
| 9,892,365 | B2 | 2/2018 | Rigetti |
| 9,978,020 | B1 | 5/2018 | Gambetta |
| 9,979,400 | B1 | 5/2018 | Sete |
| 9,996,801 | B2 | 6/2018 | Shim |
| 10,063,228 | B2 * | 8/2018 | Deurloo ............... G06N 10/00 |
| 10,122,351 | B1 | 11/2018 | Naaman |
| 10,127,499 | B1 | 11/2018 | Rigetti |
| 10,192,168 | B2 | 1/2019 | Rigetti |
| 10,333,503 | B1 | 6/2019 | Cohen et al. |
| 10,454,459 | B1 | 10/2019 | Cohen |
| 10,505,524 | B1 | 12/2019 | Cohen |
| 10,560,076 | B1 | 2/2020 | Cohen |
| 10,637,449 | B1 | 4/2020 | Cohen et al. |
| 10,659,018 | B1 | 5/2020 | Cohen |
| 10,666,238 | B1 | 5/2020 | Cohen |
| 2016/0125311 | A1 | 5/2016 | Fuechsle et al. |
| 2016/0267032 | A1 * | 9/2016 | Rigetti ............... G06F 15/80 |
| 2016/0292586 | A1 | 10/2016 | Rigetti et al. |
| 2017/0214410 | A1 | 7/2017 | Hincks et al. |
| 2017/0364796 | A1 | 12/2017 | Wiebe |
| 2018/0032893 | A1 | 2/2018 | Epstein |
| 2018/0123597 | A1 | 5/2018 | Sete |
| 2018/0260245 | A1 | 9/2018 | Smith |
| 2018/0260730 | A1 | 9/2018 | Reagor |
| 2018/0260732 | A1 | 9/2018 | Bloom |
| 2018/0308007 | A1 | 10/2018 | Amin |
| 2018/0322409 | A1 | 11/2018 | Barends |
| 2018/0365585 | A1 | 12/2018 | Smith |
| 2019/0042965 | A1 | 2/2019 | Clarke |
| 2019/0042970 | A1 | 2/2019 | Zou |
| 2019/0042972 | A1 | 2/2019 | Zou |
| 2019/0042973 | A1 | 2/2019 | Zou |
| 2019/0049495 | A1 * | 2/2019 | Ofek ............... G06F 17/14 |

FOREIGN PATENT DOCUMENTS

| | | |
|---|---|---|
| CN | 110085094 A | 8/2019 |
| WO | 2015/178992 | 11/2015 |
| WO | 2017139683 A1 | 8/2017 |

OTHER PUBLICATIONS

Int'l Search Report and Written Opinion Appln No. PCT/IB2019/001410 dated Jun. 10, 2020.

Int'l Search Report and Written Opinion Appln No. PCT/IB2019/001394 dated Jun. 17, 2020.

Zhang J, Hegde SS, Suter D. Pulse sequences for controlled 2-and 3-qubit gates in a hybrid quantum register. arXiv preprint arXiv:1806.08408. Jun. 21, 2018.

Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009;17(15):12929-43.

Int'l Search Report and Written Opinion Appln No. PCT/IB2020/000218 dated Aug. 11, 2020.

Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).

* cited by examiner

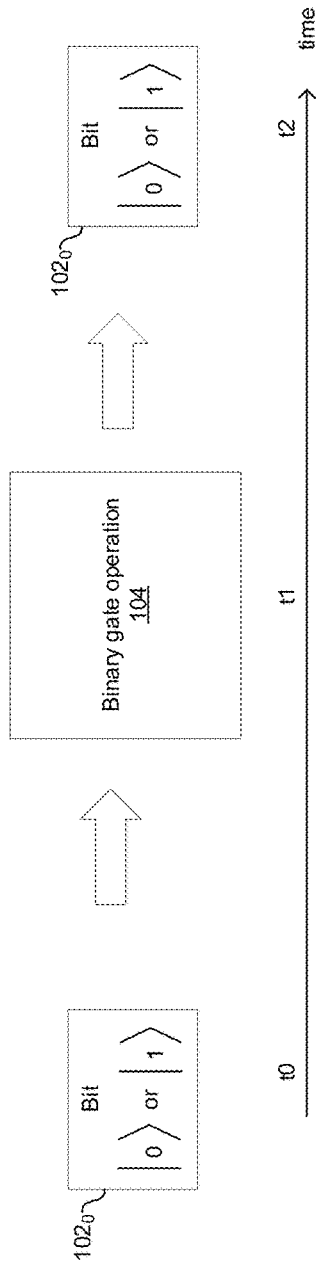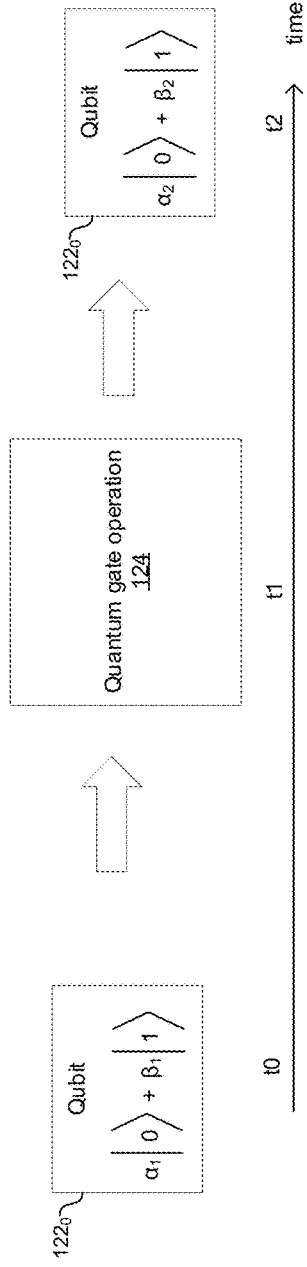

FIG. 6B

SYNCHRONIZATION IN A QUANTUM CONTROLLER WITH MODULAR AND DYNAMIC PULSE GENERATION AND ROUTING

PRIORITY CLAIM

This application is a continuation of U.S. patent application Ser. No. 16/666,461 filed Oct. 29, 2019, which is a continuation of U.S. patent application Ser. No. 16/294,367 filed Mar. 6, 2019. Each of the above referenced applications is hereby incorporated herein by reference in its entirety.

TECHNICAL FIELD

Aspects of the present application relate to quantum computer control systems. More specifically, to methods and systems for synchronization in a quantum controller with dynamic pulse routing.

BACKGROUND

Limitations and disadvantages of conventional approaches to quantum computer control systems will become apparent to one of skill in the art, through comparison of such approaches with some aspects of the present method and system set forth in the remainder of this disclosure with reference to the drawings.

BRIEF SUMMARY

Methods and systems are provided for synchronization in a quantum controller with modular and dynamic pulse generation and routing, substantially as illustrated by and/or described in connection with at least one of the figures, as set forth more completely in the claims.

BRIEF DESCRIPTION OF THE DRAWINGS

FIGS. 1A and 1B compare some aspects of classical (binary) computing and quantum computing.

FIGS. 6A-7C illustrates synchronization in example implementations of the quantum controller of FIG. 3A.

DETAILED DESCRIPTION

Figure 2:
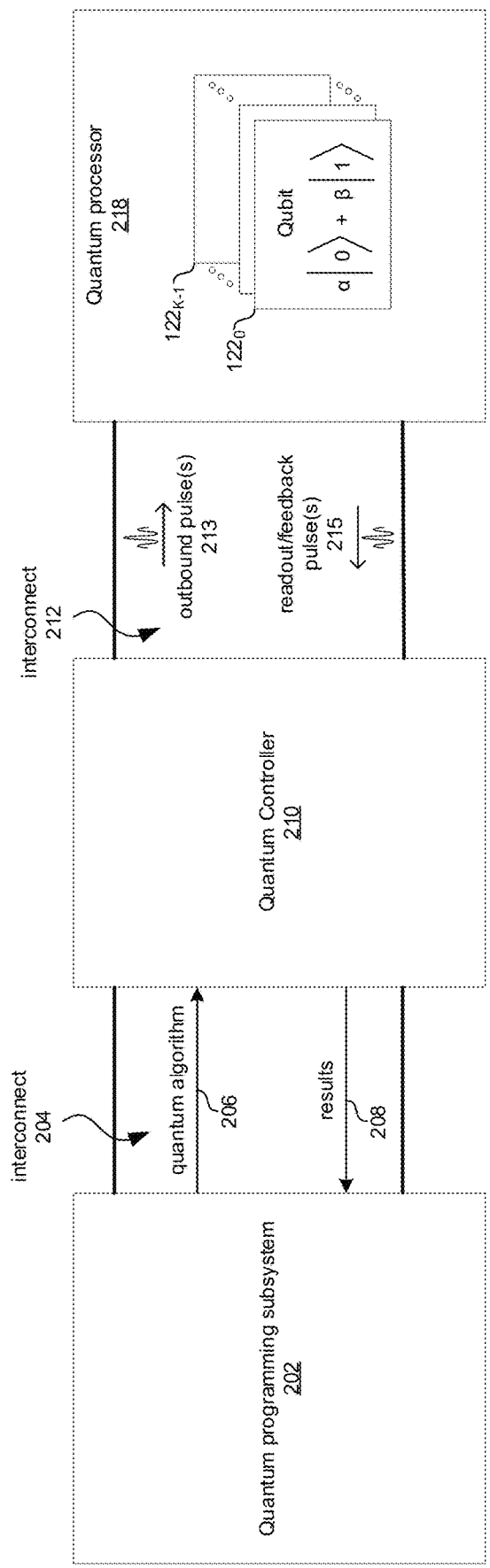
FIG. 2 shows an example quantum computing system.

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Shown in FIG. 1A is a simple example of a classical computer configured to a bit 102 and apply a single logic operation 104 to the bit 102. At time t0 the bit 102 is in a first state, at time t1 the logic operation 104 is applied to the bit 102, and at time t2 the bit 102 is in a second state determined by the state at time t0 and the logic operation. So, for example, the bit 102 may typically be stored as a voltage (e.g., 1 Vdc for a "1" or 0 Vdc for a "0") which is applied to an input of the logic operation 104 (comprised of one or more transistors). The output of the logic gate is then either 1 Vdc or 0 Vdc, depending on the logic operation performed.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle+|1\rangle$, where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. $|0\rangle$ and $|1\rangle$ can also be represented by two-dimensional basis vectors $$\begin{bmatrix}1\\0\end{bmatrix} \text{ and } \begin{bmatrix}0\\1\end{bmatrix},$$

respectively, and then the qubit state is represented by $$\begin{bmatrix}\alpha\\\beta\end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers (in fact some problems that are intractable for classical computers may become trivial for quantum computers).

Shown in FIG. 1B is a simple example of a quantum computer configured to store a qubit 122 and apply a single quantum gate operation 124 to the qubit 122. At time t0 the qubit 122 is described by $\alpha_1|0\rangle+\beta_1|1\rangle$, at time t1 the logic operation 104 is applied to the qubit 122, and at time t2 the qubits 122 is described by $\alpha_2|0\rangle+\beta_2|1\rangle$.

Unlike a classical bit, a qubit cannot be stored as a single voltage value on a wire. Instead, a qubit is physically realized using a two-level quantum mechanical system. Many physical implementations of qubits have been proposed and developed over the years with some being more promising than others. Some examples of leading qubits implementations include superconducting circuits, spin qubits, and trapped ions.

It is the job of the quantum controller to generate the precise series of external signals, usually pulses of electromagnetic waves and pulses of base band voltage, to perform the desired logic operations (and thus carry out the desired quantum algorithm). Example implementations of a quantum controller are described in further detail below.

FIG. 2 shows an example quantum computing system. The system comprises a quantum programming subsystem 202, a quantum controller 210, and a quantum processor 218.

The quantum programming subsystem 202 comprises circuitry operable to generate a quantum algorithm description 206 which the quantum controller 210 can execute to carry out the quantum algorithm on the quantum processor 218 (i.e., generate the necessary outbound quantum pulse(s) 213) with little or no human intervention during runtime of the algorithm. In an example implementation, the quantum programming subsystem 202 is a personal computer having installed on it a quantum controller software development kit (SDK) that enables a user to generate the quantum algorithm description 206 using a programming language. In an example implementation, the programming language may be a low-level language which has little or no abstraction from the instruction set used by the specific hardware of the quantum controller 210. Such instructions may be converted to machine code of the quantum controller 210 without need of a compiler or interpreter. In an example implementation, the programming language may be a high-level language which is much more abstracted from the particular hardware of the quantum controller 210. Such instructions may be compiled into machine code before they can be run on the quantum controller 210. In an example implementation the description 206 may be a machine code description of the quantum algorithm. In an example implementation, the description 206 may be a high-level description which the quantum controller 210 may itself compile into machine code. In an example implementation, the description 206 may be a high-level description which the quantum controller 210 may interpret into machine code during runtime. In an example implementation, an operating system or other software layer may run on the quantum controller 210 and the quantum algorithm description 206 may be software instructions that make use of an application programming interface (API) of the software running on the quantum controller 210.

The quantum programming subsystem 202 is coupled to the quantum controller 210 via interconnect 204 which may, for example, utilize universal serial bus (USB), peripheral component interconnect (PCIe) bus, wired or wireless Ethernet, or any other suitable communication protocol.

The quantum controller 210 comprises circuitry operable to load the quantum algorithm description 206 and then perform the quantum algorithm as per the quantum algorithm description 206. In an example implementation, quantum algorithm description 206 is machine code (i.e., series of binary vectors that represent instructions that the quantum controller's hardware can interpret and execute directly) which is loaded into the quantum controller 210. Then, execution of the machine code by the quantum controller 210 causes the quantum controller 210 to generate the necessary outbound pulse(s) 213 that correspond to the desired operations to be performed on the quantum processor 218 (e.g., sent to qubit(s) for manipulating a state of the qubit(s) or to readout resonator(s) for reading the state of the qubit(s), etc.). Depending on the quantum algorithm to be performed, outbound pulse(s) 213 for carrying out the algorithm may be predetermined at design time and/or may need to be determined during runtime. The runtime determination of the pulses may comprise performance of classical calculations and processing in the quantum controller 210 and/or the quantum programing subsystem 202 during runtime of the algorithm (e.g., runtime analysis of inbound pulses 215 received from the quantum processor 218).

Upon completion of a quantum algorithm and/or during a runtime of a quantum algorithm by the quantum controller 210, the quantum controller 210 may output data/results 298 to the quantum programming subsystem 202. In an example implementation these results may be used to generate a new quantum algorithm description 206 for a subsequent run of the quantum algorithm and/or update the quantum algorithm description during runtime.

The quantum controller 210 is coupled to the quantum processor 218 via interconnect 212 which may comprise, for example, one or more conductors and/or optical fibers.

Figure 3A:
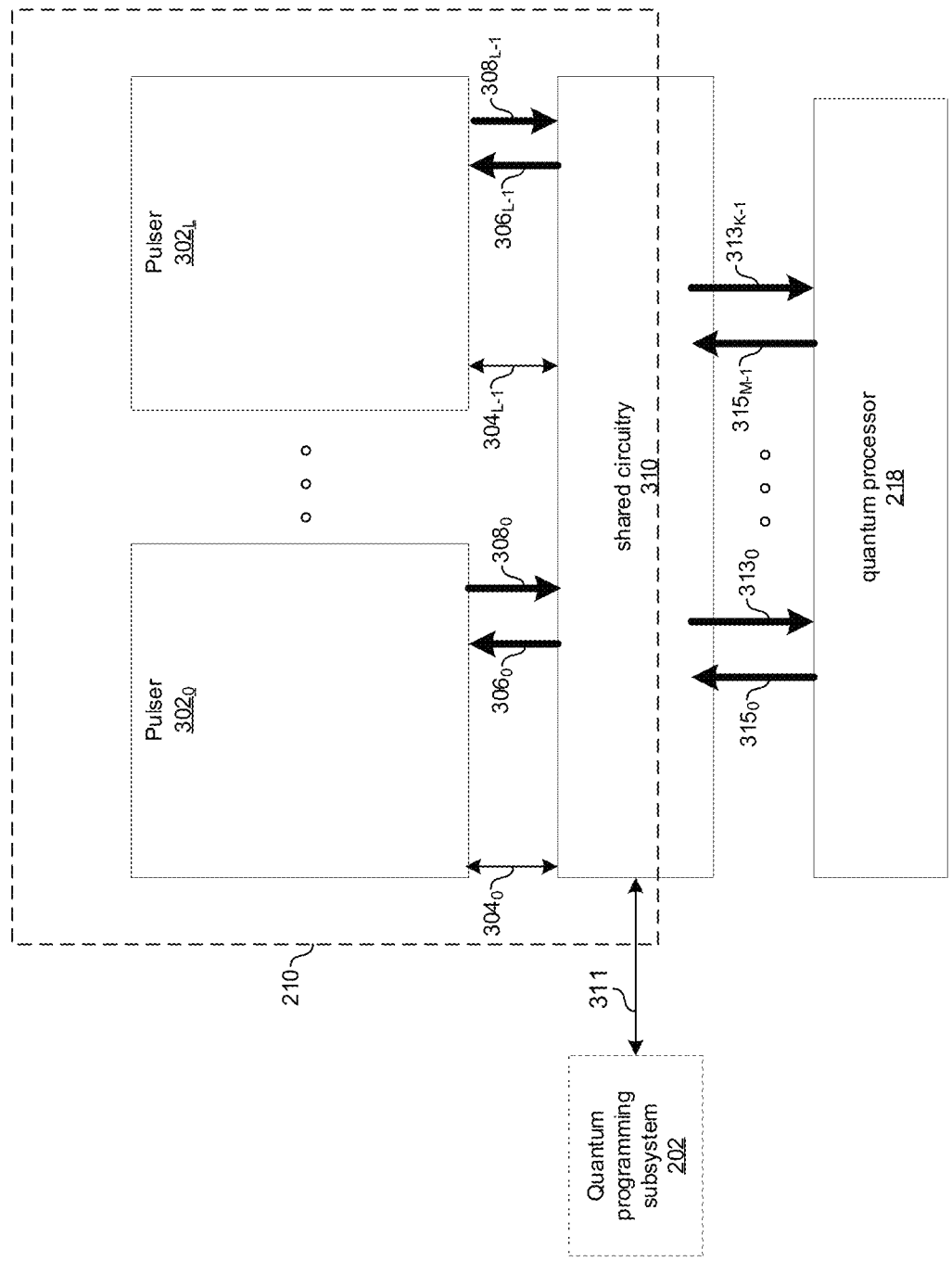
FIG. 3A shows an example quantum controller architecture in accordance with various example implementations of this disclosure.

The quantum processor 218 comprises K (an integer) quantum elements 122, which includes qubits (which could be of any type such as superconducting, spin qubits, ion trapped, etc.), and, where applicable, any other element(s) for processing quantum information, storing quantum information (e.g. storage resonator), and/or coupling the outbound quantum pulses 213 and 215 between interconnect 212 and the quantum element(s) 122 (e.g., readout resonator(s)). In an example implementation in which the quantum processor comprises readout resonators (or other readout circuitry) K may be equal the total number of qubits plus the number of readout circuits. That is, if each of Q (an integer) qubits of the quantum processor 218 is associated with a dedicated readout circuit, then K may be equal to 2 Q. For ease of description, the remainder of this disclosure will assume such an implementation, but it need not be the case in all implementations. Other elements of the quantum processor 218 may include, for example, flux lines (electronic lines for carrying current), gate electrodes (electrodes for voltage gating), current/voltage lines, amplifiers, classical logic circuits residing on-chip in the quantum processor 218, and/or the like FIG. 3A shows an example quantum controller architecture in accordance with various example implementations of this disclosure. The quantum controller 210 comprises L (an integer≥1) pulser circuits $302_0$-$302_{L-1}$ and shared circuitry 310.

In the example implementation shown, each pulser circuit $302_l$ (l an integer between 0 and L−1) comprises circuitry for exchanging information over signal paths $304_l$, $306_l$, and $308_l$, where the signal path $308_l$ carries outbound pulses (e.g., 213 of FIG. 2) generated by the pulser circuit $302_l$ (which may be control pulses sent to the quantum processor 128 to manipulate a state of one or more qubits and/or readout pulses to readout a state of one or more qubits), the signal path $306_l$ carries inbound quantum element readout pulses (e.g., 215 of FIG. 2) to be processed by the pulser circuit $302_l$, and signal path $304_l$ carries control information.

Each signal path may comprise one or more conductors, optical channels, and/or wireless channels.

Each pulser circuit $302_l$ comprises circuitry operable to generate outbound pulses on signal path $308_l$ according to quantum control operations to be performed on the quantum processor 218. This involves very precisely controlling characteristics such as phase, frequency, amplitude, and timing of the outbound pulses. The characteristics of an outbound pulse generated at any particular time may be determined, at least in part, on inbound pulses received from the quantum processor 218 (via shared circuitry 310 and signal path $306_l$) at a prior time. In an example implementation, the time required to close the feedback loop (i.e., time from receiving a first pulse on one or more of paths $315_1$-$315_L$ (e.g., at an analog to digital converter of the path) to sending a second pulse on one or more of paths $313_0$-$313_{L-1}$ (e.g., at an output of a digital-to-analog converter of the path), where the second pulse is based on the first pulse) is significantly less than the coherence time of the qubits of the quantum processor 218. For example, the time to close the feedback loop may be on the order of 100 nanoseconds. It should be noted that each signal path in FIG. 3A may in practice be a pair of signal paths for supporting generation of phase-quadrature ("I" and "Q") pulse pairs.

In the example implementation shown, the shared circuitry 310 comprises circuitry for exchanging information with the pulser circuits $302_0$-$302_{L-1}$ over signal paths $304_0$-$304_{L-1}$, $306_0$-$306_{L-1}$, and $308_0$-$308_{L-1}$, where each signal path $308_l$ carries outbound pulses generated by the pulser circuit $302_l$, each signal path $306_l$ carries inbound pulses to be processed by pulser circuit $302_l$, and each signal path $304_l$ carries control information such as flag/status signals, data read from memory, data to be stored in memory, data streamed to/from the quantum programming subsystem 202, and data to be exchanged between two or more pulsers $302_0$-$302_L$. Similarly, in the example shown the shared circuitry 310 comprises circuitry for exchanging information with the quantum processor 218 over signal paths $315_0$-$315_{M-1}$ and $313_1$-$313_{K-1}$, where each signal path $315_m$ (m an integer between 0 and M-1) carries inbound pulses from the quantum processor 218, and each signal path $313_k$ (k an integer between 0 and K-1) carries outbound pulses to the quantum processor 218. Additionally, in the example shown the shared circuitry 310 comprises circuitry for exchanging information with the quantum programming subsystem over signal path 311. The shared circuitry 310 may be: integrated with the quantum controller (e.g., on the same field programmable gate array or application specific integrated circuitry or printed circuit board); external to the quantum controller (e.g., on a separate FPGA, ASIC, or PCB connected to the quantum controller via one or more cables, backplanes, in other devices connected to the quantum processor 218, etc.); or partially integrated with the quantum controller and partially external to the quantum controller.

In various implementations, M may be less than, equal to, or greater than L, K may be less than, equal to, or greater than L, and M may be less than, equal to, or greater than K. For example, the nature of some quantum algorithms is such that not all K quantum elements need to be driven at the same time. For such algorithms, L may be less than K and one or more of the L pulsers $302_l$ may be shared among multiple of the K quantum elements circuits. That is, any pulser $302_l$ may generate pulses for different quantum elements at different times. This ability of a pulser $302_l$ to generate pulses for different quantum elements at different times can reduce the required number of pulsers $302_0$-$302_{L-1}$ (i.e., reduce L) required to support a given number of quantum elements (thus saving significant resources, cost, size, overhead when scaling to larger numbers of qubits, etc.).

The ability of a pulser $302_l$ to generate pulses for different quantum elements at different times also enables reduced latency. As just one example, assume a quantum algorithm which needs to send a pulse to quantum element $122_0$ at time T1, but whether the pulse is to be of a first type or second type (e.g., either an X pulse or a Hadamard pulse) cannot be determined until after processing an inbound readout pulse at time T1-DT (i.e., DT time intervals before the pulse is to be output). If there were a fixed assignment of pulsers $302_0$-$302_{L-1}$ to quantum elements of the quantum processor 218 (i.e., if $302_0$ could only send pulses to quantum element $122_0$, and $302_1$ could only send pulses to quantum element $122_1$, and so on), then pulser $302_0$ might not be able to start generating the pulse until it determined what the type was to be. In the depicted example implementation, on the other hand, pulser $302_0$ can start generating the first type pulse and pulser $302_1$ can start generating the second type pulse and then either of the two pulses can be released as soon as the necessary type is determined. Thus, if the time to generate the pulse is $T_{lat}$, in this example the example quantum controller 210 may reduce latency of outputting the pulse by $T_{lat}$.

The shared circuitry 310 is thus operable to receive pulses via any one or more of the signals paths $308_0$-$308_{L-1}$ and/or $315_0$-$315_{M-1}$, process the received pulses as necessary for carrying out a quantum algorithm, and then output the resulting processed pulses via any one or more of the signal paths $306_0$-$306_{L-1}$ and/or $313_0$-$313_{K-1}$. The processing of the pulses may take place in the digital domain and/or the analog domain. The processing may comprise, for example: frequency translation/modulation, phase translation/modulation, frequency and/or time division multiplexing, time and/or frequency division demultiplexing, amplification, attenuation, filtering in the frequency domain and/or time domain, time-to-frequency-domain or frequency-to-time-domain conversion, upsampling, downsampling, and/or any other signal processing operation. At any given time, the decision as to from which signal path(s) to receive one or more pulse(s), and the decision as to onto which signal path(s) to output the pulse(s) may be: predetermined (at least in part) in the quantum algorithm description; and/or dynamically determined (at least in part) during runtime of the quantum algorithm based on classical programs/computations performed during runtime, which may involve processing of inbound pulses. As an example of predetermined pulse generation and routing, a quantum algorithm description may simply specify that a particular pulse with predetermined characteristics is to be sent to signal path $313_1$ at a predetermined time. As an example of dynamic pulse determination and routing, a quantum algorithm description may specify that a readout pulse at time T-DT should be analyzed and its characteristics (e.g., phase, frequency, and/or amplitude) used to determine whether at time T pulser $302_l$ should output a pulse to a first quantum element or to a second quantum element. In various implementations of the quantum controller 210, the shared circuitry 310 may perform various other functions instead of and/or in addition to those described above. In general, the shared circuitry 310 may perform functions that are desired to be performed outside of the individual pulser circuits $302_0$-$302_{L-1}$. For example, a function may be desirable to implement in the shared circuitry 310 where the same function is needed by a number of pulser circuits from $302_0$-$302_{L-1}$ and thus may be shared among these pulser circuits instead of redundantly being implemented inside each pulser circuit. As another example, a function may be desirable to implement in the shared circuitry 310 where the function is not needed by all pulser circuits $302_0$-$302_{L-1}$ at the same time and/or on the same frequency and thus fewer than L circuits for implementing the function may be shared among the L pulser circuits $302_0$-$302_{L-1}$ through time and/or frequency division multiplexing. As another example, a function may be desirable to implement in the shared circuitry 310 where the function involves making decisions based on inputs, outputs, and/or state of multiple of the L pulser circuits $302_0$-$302_{L-1}$, or other circuits. Utilizing a centralized coordinator/decision maker in the shared circuitry 310 may have the benefit(s) of: (1) reducing pinout and complexity of the pulser circuits $302_0$-$302_{L-1}$; and/or (2) reducing decision-making latency. Nevertheless, in some implementations, decisions affecting multiple pulser circuits $302_0$-$302_{L-1}$ may be made by one or more of the pulser circuits $302_0$-$302_{L-1}$ where the information necessary for making the decision can be communicated among pulser circuits within a suitable time frame (e.g., still allowing the feedback loop to be closed within the qubit coherence time) over a tolerable number of pins/traces.

Figure 3B:
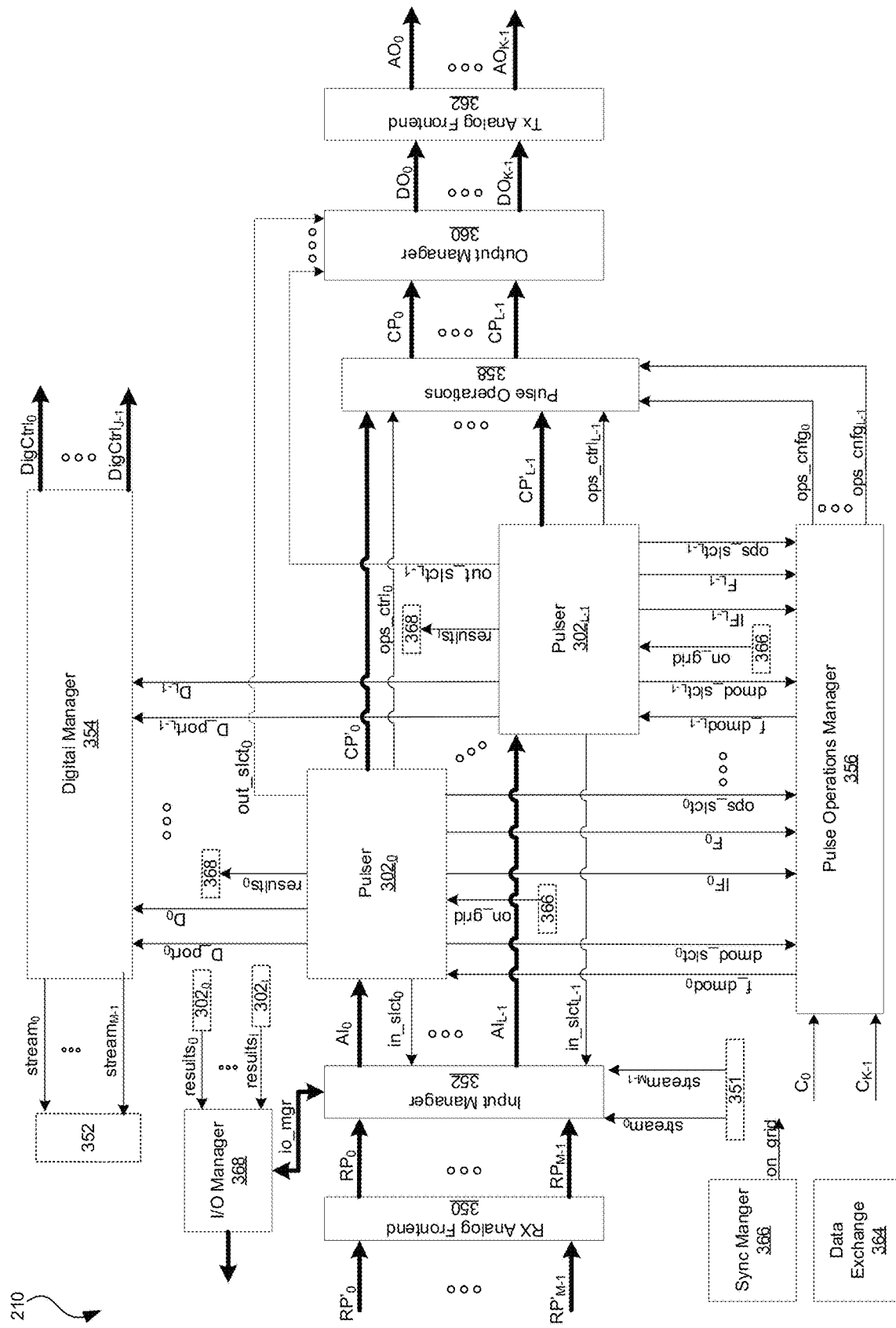
FIG. 3B shows an example implementation of the quantum controller circuitry of FIG. 3A.

FIG. 3B shows an example implementation of the quantum controller of FIG. 2. The example quantum controller shown comprises pulsers $302_1$-$302_{L-1}$, receive analog frontend 350, input manager 352, digital manager 354, pulse operations manager 356, pulse operations circuitry 358, output manager 360, transmit analog frontend 362, data exchange circuitry 364, synchronization manager 366, and input/output manager 368. Circuitry depicted in FIG. 3B other than pulser circuits $302_0$-$302_{L-1}$ corresponds to an example implementation of the shared circuitry 310 of FIG. 3A.

The receive analog frontend 350 comprises circuitry operable to concurrently process up to M (an integer≥1) analog inbound signals (RP'$_0$-RP'$_{M-1}$) received via signal paths $315_0$-$315_{M-1}$ to generate up to M concurrent inbound signals (RP$_0$-RP$_{M-1}$) to be output to input manager 352 via one or more signal paths. Although there is shown to be M signals RP and M signals RP', this need not be the case. Such processing may comprise, for example, analog-to-digital conversion, filtering, upconversion, downconversion, amplification, attenuation, time division multiplexing/demultiplexing, frequency division multiplexing/demultiplexing, and/or the like. In various implementations, M may be less than, equal to, or greater than L and M may be less than, equal to, or greater than K.

The input manager 352 comprises circuitry operable to route any one or more of signals (RP$_0$-RP$_{M-1}$) to any one or more of pulsers $302_0$-$302_{L-1}$ (as signal(s) AI$_0$-AI$_{L-1}$) and/or to other circuits (e.g. as signal io_mgr to I/O manager 368). In an example implementation, the input manager 352 comprises one or more switch networks, multiplexers, and/or the like for dynamically reconfiguring which signals RP$_0$-RP$_{M-1}$ are routed to which pulsers $302_0$-$302_{L-1}$. This may enable time division multiplexing multiple of the signals RP$_0$-RP$_{M-1}$ onto a single signal AI$_l$ and/or time division demultiplexing components (e.g., time slices) of a signal RP$_m$ onto multiple of the signals AI$_0$-AI$_L$. In an example implementation, the input manager 352 comprises one or more mixers and/or filters for frequency division multiplexing multiple of the signals RP$_0$-RP$_{M-1}$ onto a single signal AI$_l$ and/or frequency division demultiplexing components (e.g., frequency bands) of a signal RP$_m$ onto multiple of the signals AI$_0$-AI$_{L-1}$. The signal routing and multiplexing/demultiplexing functions performed by the input manager 352 enables: a particular pulser $302_l$ to process different inbound pulses from different quantum elements at different times; a particular pulser $302_l$ to process different inbound pulses from different quantum elements at the same time; and multiple of the pulsers $302_0$-$302_{L-1}$ to processes the same inbound pulse at the same time. In the example implementation shown, routing of the signals RP$_0$-RP$_{M-1}$ among the inputs of the pulsers $302_0$-$302_{L-1}$ is controlled by digital control signals in_slct$_0$-in_slct$_{L-1}$ from the pulsers $302_0$-$302_{L-1}$. In another implementation, the input manager may be operable to autonomously determine the appropriate routing (e.g., where the quantum algorithm description includes instructions to be loaded into memory of, and executed by, the input manager 352). In the example implementation, the input manager 352 is operable to rout input signals RP$_0$-RP$_{M-1}$ to the I/O manager 368 (as signal(s) io_mgr), to be sent to the quantum programing subsystem 202. This routing may, for example, be controlled by signals from the digital manager 354. In an example implementation, for each input signal RP$_m$ there is a digital signal, stream$_m$, from the digital manager 354 to the input manager 352 that controls whether RP$_m$ will be sent from the input manager 352 to the I/O manager 368 and from there to the quantum programing subsystem 202.

Each of the pulsers $302_0$-$302_{L-1}$ is as described above with reference to FIG. 3A. In the example implementation shown, each pulsers $302_l$ is operable to generate raw outbound pulses CP'$_l$ ("raw" is used simply to denote that the pulse has not yet been processed by pulse operations circuitry 358) and digital control signals in_slct$_l$, D_port$_l$, D$_l$, out_slct$_l$, ops_ctrl$_l$, ops_slct$_l$, IF$_l$, F$_l$, and dmod_sclt$_l$ for carrying out quantum algorithms on the quantum processor 218, and results$_l$ for carrying intermediate and/or final results generated by the pulser $302_l$ to the quantum programming subsystem 202. One or more of the pulsers $302_0$-$302_{L-1}$ may receive and/or generate additional signals which are not shown in FIG. 3A for clarity of illustration. The raw outbound pulses CP'$_0$-CP'$_{L-1}$ are conveyed via signal paths $308_0$-$308_{L-1}$ and the digital control signals are conveyed via signal paths $304_0$-$304_{L-1}$. Each of the pulsers $302_l$ is operable to receive inbound pulse signal AI$_l$ and signal f_dmod$_l$. Pulser $302_l$ may process the inbound signal AI$_l$ to determine the state of certain quantum element(s) in the quantum processor 218 and use this state information for making decisions such as, for example, which raw outbound pulse CP'$_l$ to generate next, when to generate it and what control signals to generate to affect the characteristics of that raw outbound pulse appropriately. Pulser $302_l$ may use the signal f_dmod$_l$ for determining how to process inbound pulse signal AI$_l$. As an example, when pulser $302_1$ needs to process an inbound signal AI$_1$ from quantum element $122_3$, it can send a dmod_sclt$_1$ signal that directs pulse operations manager 356 to send, on f_dmod$_1$, settings to be used for demodulation of an inbound signal AI$_1$ from quantum element $122_3$ (e.g., the pulse operations manager 356 may send the value cos($\omega_3$*time_stamp+$\phi_3$), where $\omega_3$ is the frequency of quantum element $122_3$, time_stamp is amount of time passed since the reference point, for instance the time at which quantum algorithm started running, and $\phi_3$ is the phase of the total frame rotation of quantum element $122_3$, i.e. the accumulated phase of all frame rotations since the reference point).

The pulse operations circuitry 358 is operable to process the raw outbound pulses CP'$_0$-CP'$_{L-1}$ to generate corresponding output outbound pulses CP$_0$-CP$_{L-1}$. This may comprise, for example, manipulating the amplitude, phase, and/or frequency of the raw pulse CP'$_l$. The pulse operations circuitry 358 receives raw outbound pulses $CP'_0$-$CP'_{L-1}$ from pulsers $302_0$-$302_{L-1}$, control signals $ops\_cnfg_0$-$ops\_cnfg_{L-1}$ from pulse operations manager 356, and $ops\_ctrl_0$-$ops\_ctrl_{L-1}$ from pulsers $302_0$-$302_{L-1}$.

The control signal $ops\_cnfg_l$ configures, at least in part, the pulse operations circuitry 358 such that each raw outbound pulse $CP'_l$ that passes through the pulse operations circuitry 358 has performed on it one or more operation(s) tailored for that particular pulse. To illustrate, denoting a raw outbound pulse from pulser $302_3$ at time T1 as $CP'_{3,T1}$, then, at time T1 (or sometime before T1 to allow for latency, circuit setup, etc.), the digital control signal $ops\_cnfg_3$ (denoted $ops\_cnfg_{3,T1}$ for purposes of this example) provides the information (e.g., in the form of one or more matrix, as described below) as to what specific operations are to be performed on pulse $CP'_{3,T1}$. Similarly, $ops\_cnfg_{4,T1}$ provides the information as to what specific operations are to be performed on pulse $CP'_{4,T1}$, and $ops\_cnfg_{3,T2}$ provides the information as to what specific operations are to be performed on pulse $CP'_{4,T1}$.

The control signal $ops\_ctrl_l$ provides another way for the pulser $302_l$ to configure how any particular pulse is processed in the pulse operations circuitry 358. This may enable the pulser $302_l$ to, for example, provide information to the pulse operation circuitry 358 that does not need to pass through the pulse operation manager 356. For example, the pulser $302_l$ may send matrix values calculated in real-time by the pulser $302_l$ to be used by the pulse operation circuitry 358 to modify pulse $CP'_l$. These matrix values arrive to the pulse operation circuitry 358 directly from the pulser $302_l$ and do not need to be sent to the pulse operation manager first. Another example maybe that the pulser $302_l$ provides information to the pulse operation circuitry 358 to affect the operations themselves (e.g. the signal $ops\_ctrl_l$ can choose among several different mathematical operations that can be performed on the pulse).

The pulse operations manager 356 comprises circuitry operable to configure the pulse operations circuitry 358 such that the pulse operations applied to each raw outbound pulse $CP'_l$ are tailored to that particular raw outbound pulse. To illustrate, denoting a first raw outbound pulse to be output during a first time interval T1 as $CP'_{l,T1}$, and a second raw outbound pulse to be output during a second time interval T2 as $CP'_{l,T2}$, then pulse operations circuitry 358 is operable to perform a first one or more operations on $CP'_{l,T1}$ and a second one or more operations on $CP'_{l,T2}$. The first one or more operations may be determined, at least in part, based on to which quantum element the pulse $CP_{1,T1}$ is to be sent, and the second one or more operations may be determined, at least in part, based on to which quantum element the pulse $CP_{1,T2}$ is to be sent. The determination of the first one or more operations and second one or more operations may be determined dynamically during runtime. The pulse operations circuitry 358 is operable to process each raw outbound pulse $CP'_l$ as either a single-phase pulse or as one of a quadrature-phase pulse pair. In the example implementation shown, whether a particular pulse $CP'_l$ at time T1 (i.e., $CP'_{l,T1}$) is processed as a single pulse or part of a pulse pair may be determined during runtime by the control signal pain for time T1 (i.e., $pair_{l,T1}$), as further described below with reference to FIGS. 7A-9.

The transmit analog frontend 362 comprises circuitry operable to concurrently process up to K digital signals $DO_k$ to generate up to K concurrent analog signals $AO_k$ to be output to the quantum processor 218. Such processing may comprise, for example, digital-to-analog conversion, filtering, upconversion, downconversion, amplification, attenuation, time division multiplexing/demultiplexing, frequency division multiplexing/demultiplexing and/or the like. In an example implementation, each of the one or more of signal paths $313_0$-$313_{K-1}$ (FIG. 3A) represents a respective portion of Tx analog frontend circuit 362 as well as a respective portion of interconnect 212 (FIG. 2) between the Tx analog frontend circuit 362 and the quantum processor 218. Although there is one-to-one correspondence between the number of DO signals and the number of AO signals in the example implementation described here, such does not need to be the case. In another example implementation, the analog frontend 362 is operable to map more (or fewer) signals DO to fewer (or more) signals AO. In an example implementation the transmit analog frontend 362 is operable to process digital signals $DO_0$-$DO_{K-1}$ as K single-phase outbound pulses, as K/2 phase-quadrature pulse pairs, or process some of signals $DO_0$-$DO_{K-1}$ as single-phase outbound pulses and some signals $DO_0$-$DO_{K-1}$ as phase-quadrature pulse pairs (at different times and/or concurrently).

The output manager 360 comprises circuitry operable to route any one or more of signals $CP_0$-$CP_{L-1}$ to any one or more of signal paths $313_0$-$313_{K-1}$. As just one possible example, signal path $313_0$ may comprise a first path through the analog frontend 362 (e.g., a first mixer and DAC) that outputs $AO_0$ and traces/wires of interconnect 212 that carry signal $AO_0$; signal path $313_1$ may comprise a second path through the analog frontend 362 (e.g., a second mixer and DAC) that outputs $AO_1$ and traces/wires of interconnect 212 that carry signal $AO_1$, and so on. In an example implementation, the output manager 360 comprises one or more switch networks, multiplexers, and/or the like for dynamically reconfiguring which one or more signals $CP_0$-$CP_{L-1}$ are routed to which signal paths $313_0$-$313_{K-1}$. This may enable time division multiplexing multiple of the signals $CP_0$-$CP_{L-1}$ onto a single signal path $313_k$ and/or time division demultiplexing components (e.g., time slices) of a signal $CP_m$ onto multiple of the signal paths $313_0$-$313_{K-1}$. In an example implementation, the output manager 360 comprises one or more mixers and/or filters for frequency division multiplexing multiple of the signals $CP_0$-$CP_{M-1}$ onto a single signal path $313_k$ and/or frequency division demultiplexing components (e.g., frequency bands) of a signal $CP_m$ onto multiple of the signal paths $313_0$-$313_{K-1}$. The signal routing and multiplexing/demultiplexing functions performed by the output manager 360 enables: routing outbound pulses from a particular pulser $302_l$ to different ones of the signal paths $313_0$-$313_{K-1}$ at different times; routing outbound pulses from a particular pulser $302_l$ to multiple of the signal paths $313_0$-$313_{K-1}$ at the same time; and multiple of the pullers $302_0$-$302_{L-1}$ generating pulses for the same signal path $313_k$ at the same time. In the example implementation shown, routing of the signals $CP_0$-$CP_{L-1}$ among the signal paths $313_0$-$313_{K-1}$ is controlled by digital control signals $out\_slct_0$-$out\_slct_{L-1}$ from the pulsers $302_0$-$302_{L-1}$. In another implementation, the output manager 360 may be operable to autonomously determine the appropriate routing (e.g., where the quantum algorithm description includes instructions to be loaded into memory of, and executed by, the output manager 360). In an example implementation, at any given time, the output manager 360 is operable to concurrently route K of the digital signals $CP_0$-$CP_{L-1}$ as K single-phase outbound pulses, concurrently route K/2 of the digital signals $CP_0$-$CP_{L-1}$ as phase-quadrature pulse pairs, or route some of signals $CP_0$-$CP_{L-1}$ as single-phase outbound pulses and some others of the signals $CP_0$-$CP_{L-1}$ as phase-quadrature pulse pairs (at different times and/or concurrently).

The digital manager 354 comprises circuitry operable to process and/or route digital control signals (DigCtrl$_0$-DigCtrl$_{J-1}$) to various circuits of the quantum controller 210 and/or external circuits coupled to the quantum controller 210. In the example implementation shown, the digital manager receives, from each pulser 302$_l$, (e.g., via one or more of signal paths 304$_0$-304$_{N-1}$) a digital signal Di that is to be processed and routed by the digital manager 354, and a control signal D_port$_l$ that indicates to which output port(s) of the digital manager 354 the signal D$_l$ should be routed. The digital control signals may be routed to, for example, any one or more of circuits shown in FIG. 3B, switches/gates which connect and disconnect the outputs AO$_0$-AO$_{K-1}$ from the quantum processor 218, external circuits coupled to the quantum controller 210 such as microwave mixers and amplifiers, and/or any other circuitry which can benefit from on real-time information from the pulser circuits 302$_0$-302$_{L-1}$. Each such destination of the digital signals may require different operations to be performed on the digital signal (such as delay, broadening, or digital convolution with a given digital pattern). These operations may be performed by the digital manager 354 and may be specified by control signals from the pulsers 302$_0$-302$_{L-1}$. This allows each pulser 302$_l$ to generate digital signals to different destinations and allows different ones of pulse generators 302$_0$-302$_{L-1}$ to generate digital signals to the same destination while saving resources.

The synchronization manager 366 comprises circuitry operable to manage synchronization of the various circuits shown in FIG. 3B. Such synchronization is advantageous in a modular and dynamic system, such as quantum controller 210, where different ones of pulsers 302$_0$-302$_{L-1}$ generate, receive, and process pulses to and from different quantum elements at different times. For example, while carrying out a quantum algorithm, a first pulser circuit 302$_1$ and a second pulser circuit 302$_2$ may sometimes need to transmit pulses at precisely the same time and at other times transmit pulses independently of one another. In the example implementation shown, the synchronization manager 366 reduces the overhead involved in performing such synchronization. An example implementation of the sync manager 366 is described below with reference to FIG. 3C.

The data exchange circuitry 364 is operable to manage exchange of data among the various circuits shown in FIG. 3B. For example, while carrying out a quantum algorithm, first pulser circuit 302$_1$ and a second pulser circuit 302$_2$ may sometimes need to exchange information. As just one example, pulser 302$_1$ may need to share, with pulser 302$_2$, the characteristics of an inbound signal Al$_1$ that it just processed so that pulser 302$_2$ can generate a raw outbound pulse CP'$_2$ based on the characteristics of Al$_1$. The data exchange circuitry 364 may enable such information exchange. In an example implementation, the data exchange circuitry 364 may comprise one or more registers to and from which the pulsers 302$_0$-302$_{L-1}$ can read and write.

The I/O manager 368 is operable to route information between the quantum controller 210 and the quantum programming subsystem 202.

Figure 3C:
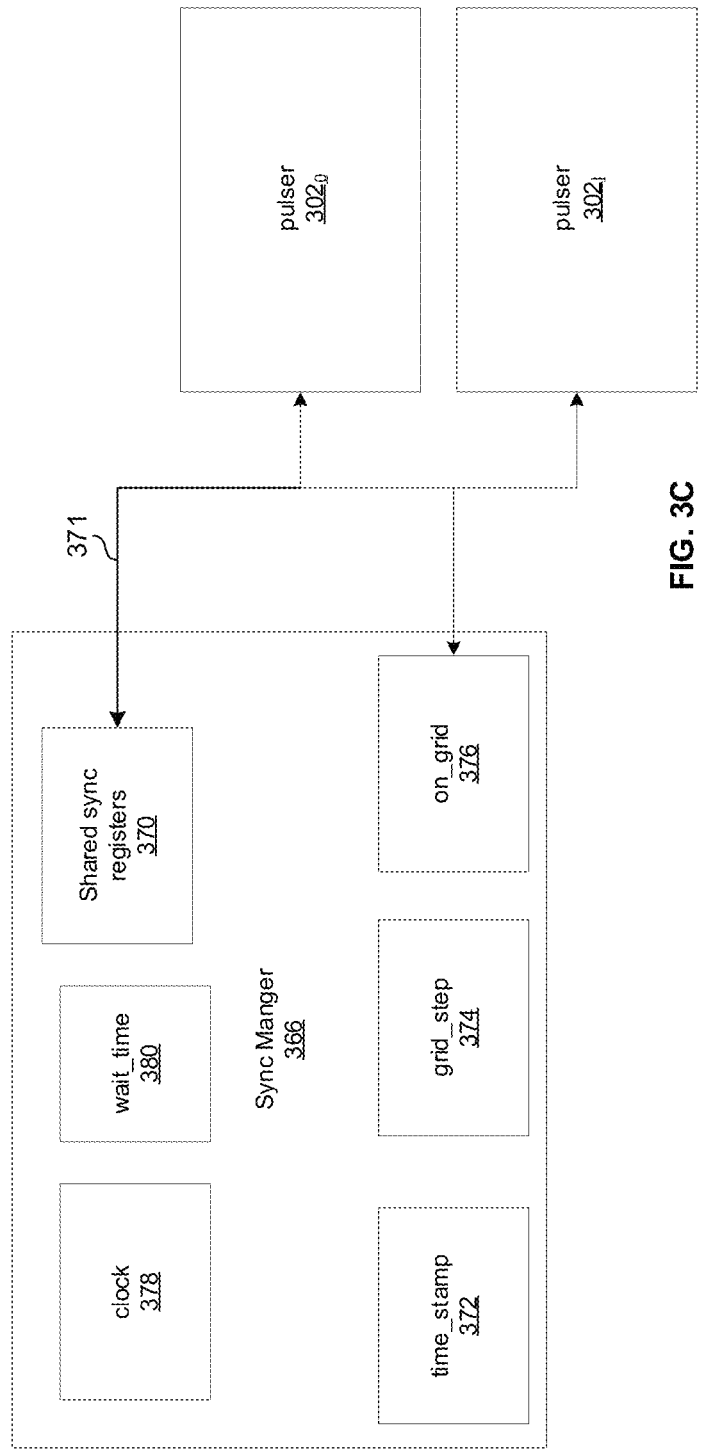
FIG. 3C shows an example implementation of the sync manager circuitry of FIG. 3B.

FIG. 3C shows an example implementation of the sync manager circuitry of FIG. 3B. The example sync manager circuitry 366 comprises shared sync registers 370, time_stamp register 372, grid_step register 374, wait_time register 380, and on_grid register 376. Each of the registers may comprise hardware and/or software registers. The pulsers 302$_0$-302$_l$ exchange information with the sync manager 366 over the data bus 371. This may comprise, the pulsers 302$_0$-302$_l$ writing to and reading from shared sync registers 370 and the on-grid register 376 is output as signal on_grid to pulsers 302$_0$-302$_1$ in data bus 371. Example implementations of the quantum controller which use the registers of FIG. 3C for transitioning between asynchronous and synchronous operation of pulsers is described below with reference to FIGS. 6A-7C. Also shown is a clock circuit 378 (e.g., a crystal oscillator, PLL, and/or any other suitable clock signal generation circuit).

The contents of the grid_step register 374 and the wait_time register 380 may be set during a calibration routine in which the quantum controller 220 determines: (1) the signal travel time between two or more pairs of pulsers 302$_0$-302$_{L-1}$ and/or between two or more of pulsers 302$_0$-302$_{L-1}$ and sync manager 366; and (2) the uncertainty in these travel times. The value of wait_time register 380 may then be set based on the signal travel times and the value of the grid_step register may be set based on the uncertainty in the signal travel times.

Figure 3D:
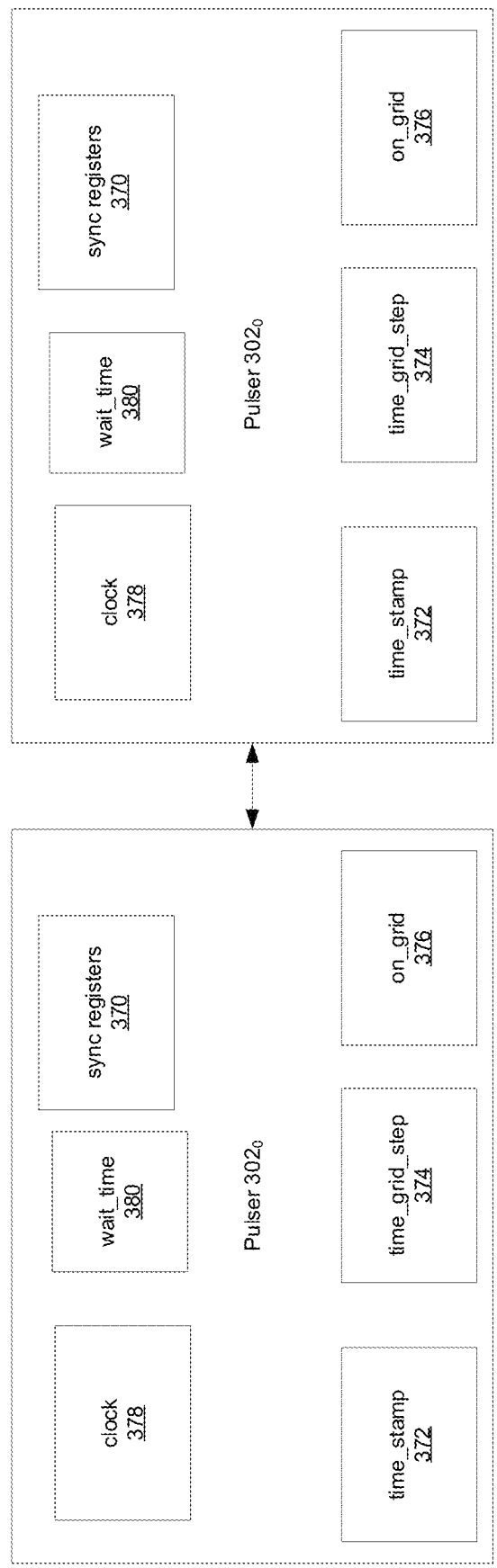
FIG. 3D shows an example implementation in which each pulser comprises registers used for pulser synchronization.

FIG. 3D shows an alternate implementation to that of FIG. 3C. In FIG. 3D, each pulser 302$_l$ has its own grid_step register 374 and on-grid register 376 and generates its own on_grid signal.

Figure 4A:
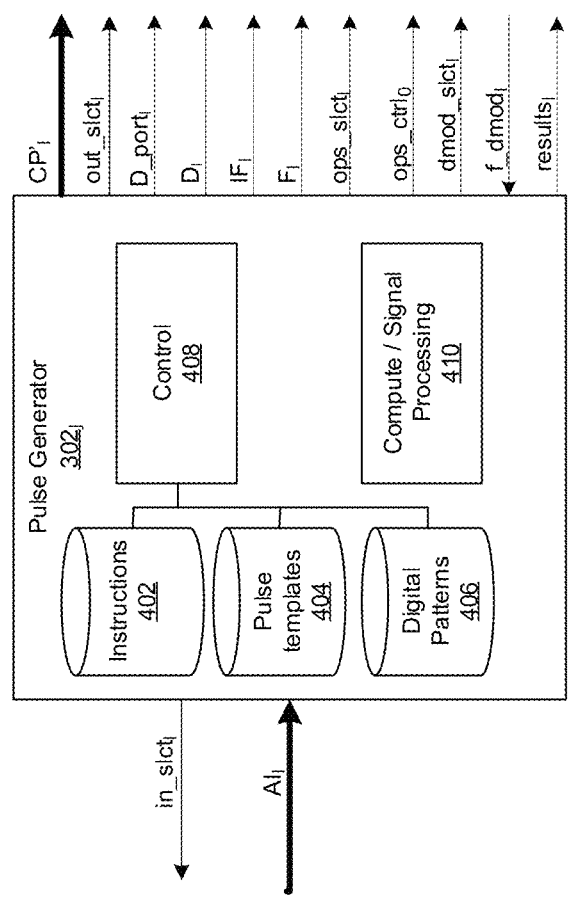
FIG. 4A shows an example implementation of the pulser of FIG. 3B.

FIG. 4A shows an example implementation of the raw pulser of FIG. 3B. The example pulser 302$_l$ shown comprises instruction memory 402, pulse template memory 404, digital pattern memory 406, control circuitry 408, and compute and/or signal processing circuitry (CSP) 410.

The memories 402, 404, 406 may comprise one or more be any type of suitable storage elements (e.g., DRAM, SRAM, Flash, etc.). The instructions stored in instruction memory 402 are instructions to be executed out by the pulser 302$_l$ for carrying out its role in a quantum algorithm. Because different pulsers 302$_0$-302$_{L-1}$ have different roles to play in any particular quantum algorithm (e.g., generating different pulses at different times), the instruction memory 402 for each pulser 302$_l$ may be specific to that pulser. For example, the quantum algorithm description 206 from the quantum programming subsystem 202 may comprise a first set of instructions to be loaded (via I/O manager 368) into pulser 302$_0$, a second set of instructions to be loaded into pulser 302$_1$, and so on. Each pulse template stored in pulse template memory 404 comprises a sequence of one or more samples of any arbitrary shape (e.g., Gaussian, sinc, impulse, etc.) representing the pulses to be sent to pulse operation circuitry 358. Each digital pattern stored in digital pattern memory 406 comprises a sequence of one or more binary values which may represent the digital pulses to be sent to the digital manager 354 for generating digital control signals DigCtrl$_0$-DigCtrl$_{J-1}$.

The control circuitry 408 is operable to execute the instructions stored in memory 402 to process inbound signal Al$_l$, generate raw outbound pulses CP'$_l$, and generate digital control signals in_slct$_l$, out_slct$_l$, D_port$_l$, D$_l$, IF$_l$, F$_l$, ops_slct$_l$, ops_ctrl$_l$, results$_l$, and dmod_slct$_l$. In the example implementation shown, the processing of the inbound signal Al$_l$ is performed by the CSP circuitry 410 and based (at least in part) on the signal f_dmod$_l$.

The compute and/or signal processing circuitry (CSP) 410 is operable to perform computational and/or signal processing functions, which may comprise, for example Boolean-algebra based logic and arithmetic functions and demodulation (e.g., of inbound signals Al$_l$).

In operation of an example implementation, generation of a raw outbound pulse CP'$_l$ comprises the control circuitry 408: (1) determining a pulse template to retrieve from pulse template memory 404 (e.g., based on a result of computations and/or signal processing performed by the CSP 410);

(2) retrieving the pulse template; (3) performing some preliminary processing on the pulse template; (4) determining the values of F, IF, ops_slct$_l$, and dmod_slct$_l$ to be sent to the pulse operation manager 356 (as predetermined in the quantum algorithm description and/or determined dynamically based on results of computations and/or signal processing performed by the CSP 410); (5) determining the value of ops_ctrl$_l$ to be sent to the pulse operation circuitry 358; (6) determining the value of in_slct$_l$ to be sent to the input manager 352; (7) determining a digital pattern to retrieve from digital pattern memory 406 (as predetermined in the quantum algorithm description and/or determined dynamically based on results of computations and/or signal processing performed by the CSP 410); (8) outputting the digital pattern as D$_l$ to the digital manager along with control signal D_port$_l$ (as predetermined in the quantum algorithm description and/or determined dynamically based on results of computations and/or signal processing performed by the CSP 410); (9) outputting the raw outbound pulse CP$'_l$ to the pulse operations circuitry 358; (10) outputting results' to the I/O manager.

Figure 4B:
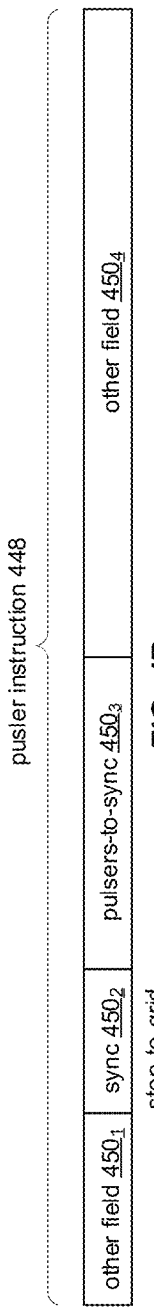
FIGS. 4B and 4C shows an example instructions executed by the pulser $302_l$.

FIG. 4B shows an example instruction executed by the pulser 302$_l$. The instruction 448 comprises a plurality of fields 450, each of which may consist of one or more bits and one of which is a step-to-grid and/or a sync field 450$_2$ and one of which may be a pulsers-to-sync field 450$_3$. The step-to-grid and/or sync field 450$_2$ indicates whether and when the pulser 302$_l$ executing the instruction 448 should prepare to execute a subsequent instruction synchronously with execution of an instruction by other of the pulsers 302$_0$-302$_L$. The pulsers-to-sync field 450$_3$ indicates which of the pulsers 302$_0$-302$_L$ should execute instructions synchronously during the subsequent instruction. In an example implementation, the pulsers-to-sync field 450$_3$ may comprise a bit for each of the pulsers 302$_0$-302$_l$ and the asserted bits in the field indicate which of the pulsers 302$_0$-302$_{L-1}$ (in the example shown in FIG. 4B) are to operate synchronously during a subsequent. For example, in such an implementation with l=6 a value of 001011 in the pulsers-to-sync field 450$_3$ indicates that pulsers 302$_0$, 302$_1$, and 302$_3$ are to be synchronized.

In the example implementation of FIG. 4B, the single field 450$_2$ is used to both indicate synchronization is required and that step-to-grid is required. Such an instruction may be used for an implementation such as those described below with reference to FIGS. 6A and 7B where an explicit step-to-grid field is not required and the need for synchronization can be indicated in the last instruction before the sync procedure or right at the beginning of the sync procedure.

Figure 4C:
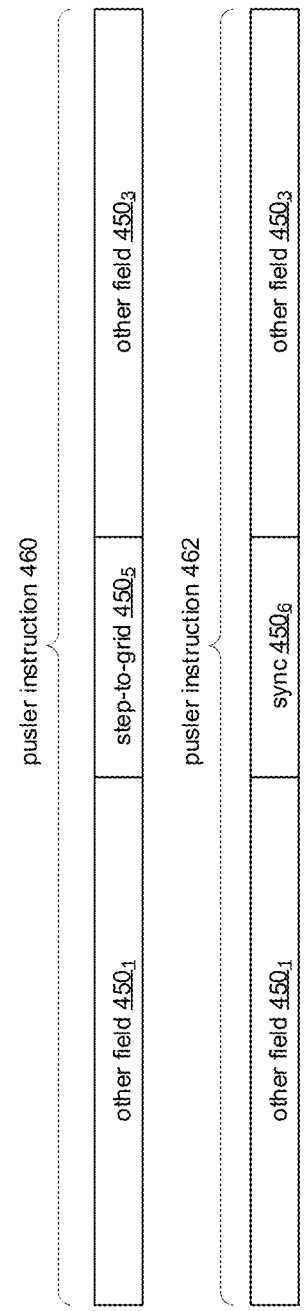

In another implementation, shown in FIG. 4C, the step-to-grid field 450$_5$ and the sync field 450$_6$ are separate fields, which may be sent in different instructions 460 and 462. Such an instruction may be used for an implementation such as those described below with reference to FIGS. 7A and 7C where, for example, a step-to-grid field may be present and asserted in the last instruction before the sync procedure and the sync field may be present and asserted in the first instruction of the sync procedure.

Figure 5A:
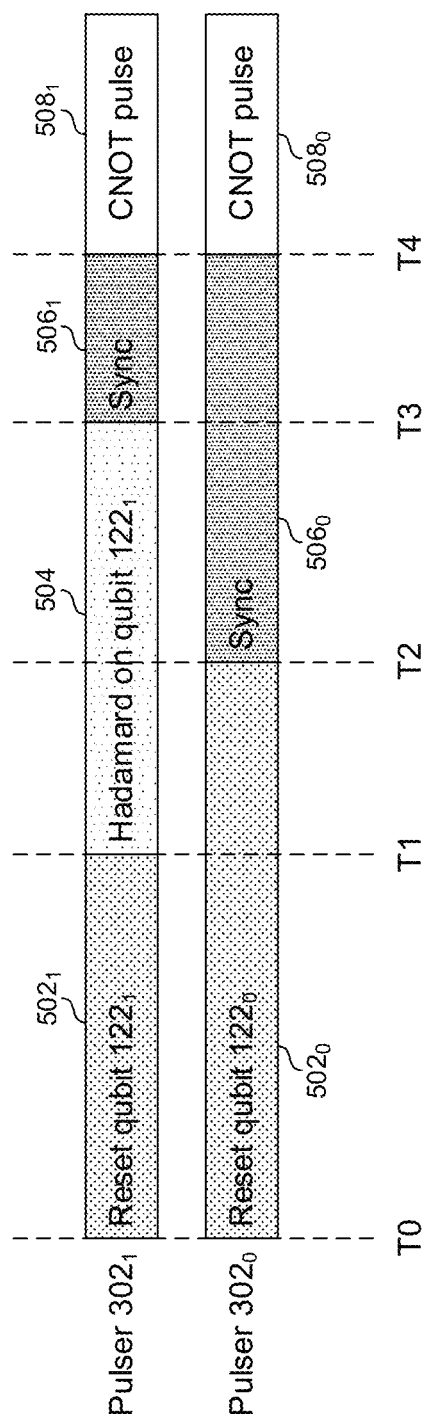
FIGS. 5A and 5B illustrate an example operation performed by the quantum controller of FIG. 3A.
Figure 5B:
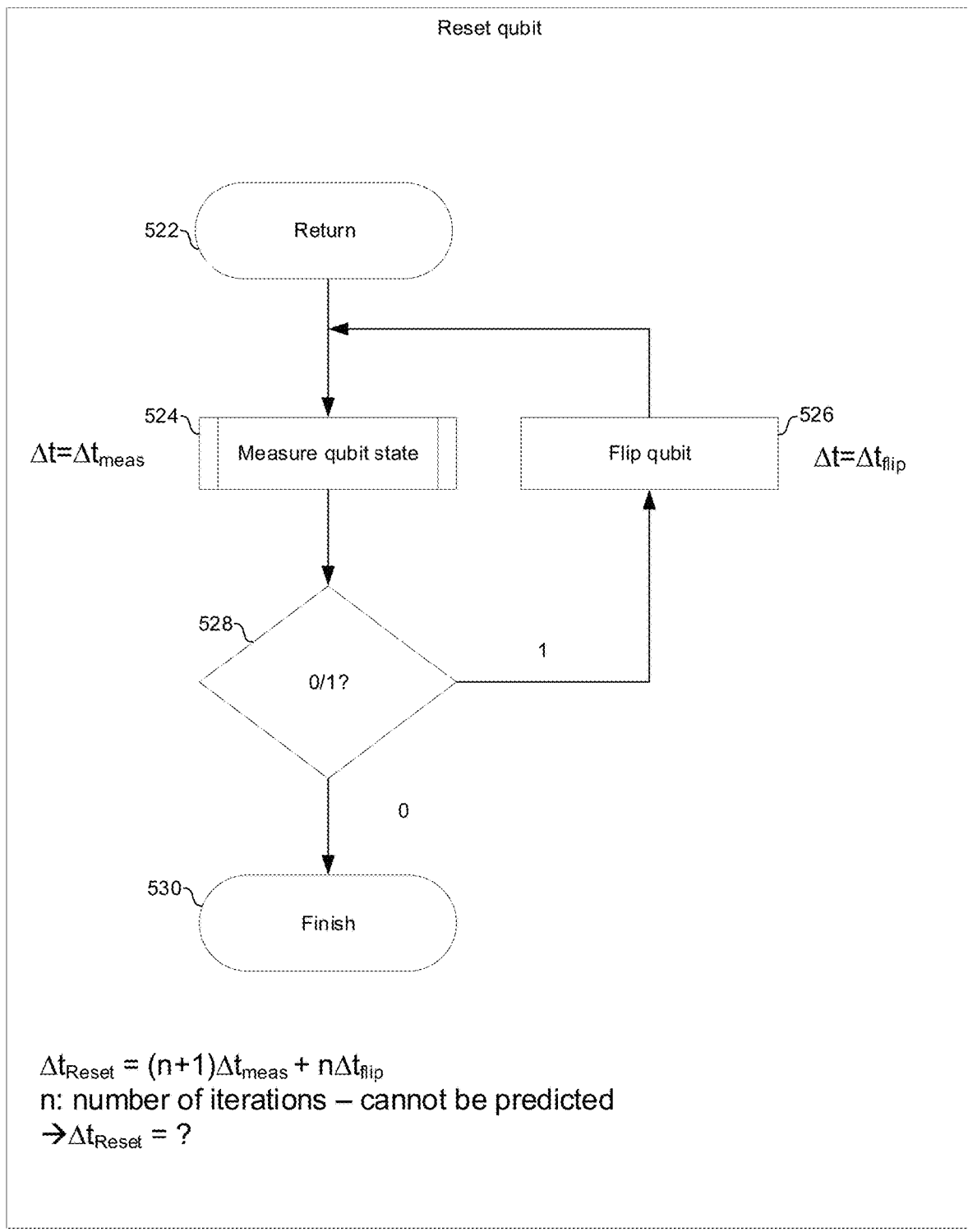

FIGS. 5A and 5B illustrate an example operation performed by the quantum controller of FIG. 3A. Specifically, the operation involves pulser 302$_0$ resetting qubit 122$_0$ to the 0 state, pulser 302$_1$ resetting qubit 122$_1$ the 0 state, pulser 302$_1$ performing a Hadamard gate operation on qubit 122$_1$, and then pulsers 302$_0$ and 302$_1$ performing a CNOT (controlled-NOT) operation, with the control qubit being qubit 122$_0$. In some implementations pulsers 302$_0$ and 302$_1$ must operate synchronously with respect to each other to perform the CNOT operation because the CNOT requires pulser 302$_0$ to send a pulse to qubit 122$_0$ and the pulser 302$_1$ to send a pulse to qubit 122$_1$ and the pulses need to be sent simultaneously ("simultaneously" may mean, for example, within hundreds of picoseconds or less of each other).

Simply synchronizing pulsers 302$_0$ and 302$_1$ at the outset of the procedure of FIG. 5A may be insufficient because the Reset process 502 takes an undetermined number of clock cycles, as described below with reference to FIG. 5B. Thus, although pulsers 302$_0$ and 302$_1$ both begin their respective resets at the same time, T0, pulser 302$_1$ completes reset 502$_1$ at time T1 but pulser 302$_0$ does not complete reset 502$_0$ until later at time T2. At time T2, pulser 302$_0$ begins executing one or more synchronization instructions during which it signals that it is ready to begin the CNOT. At time T3 pulser 302$_1$ completes the Hadamard operation 504 and then begins executing one or more sync instructions during which it signals that it is ready to begin the CNOT. Thus, after T3 both pulsers 302$_0$ and 302$_1$ are signaling ready to perform the CNOT and at time T4 they synchronously begin the CNOT.

Referring to FIG. 5B, the reset process begins with start block 522 in which the state of the qubit is measured. Next, in block 528 it is determined whether the measured state is 0 or 1. If 0, then the process advances to block 530 and is complete. If the state is not 0, the process advances to block 526 in which a signal is sent to the qubit to attempt to flip the state of the qubit, then the process returns to block 524.

Figure 6A:
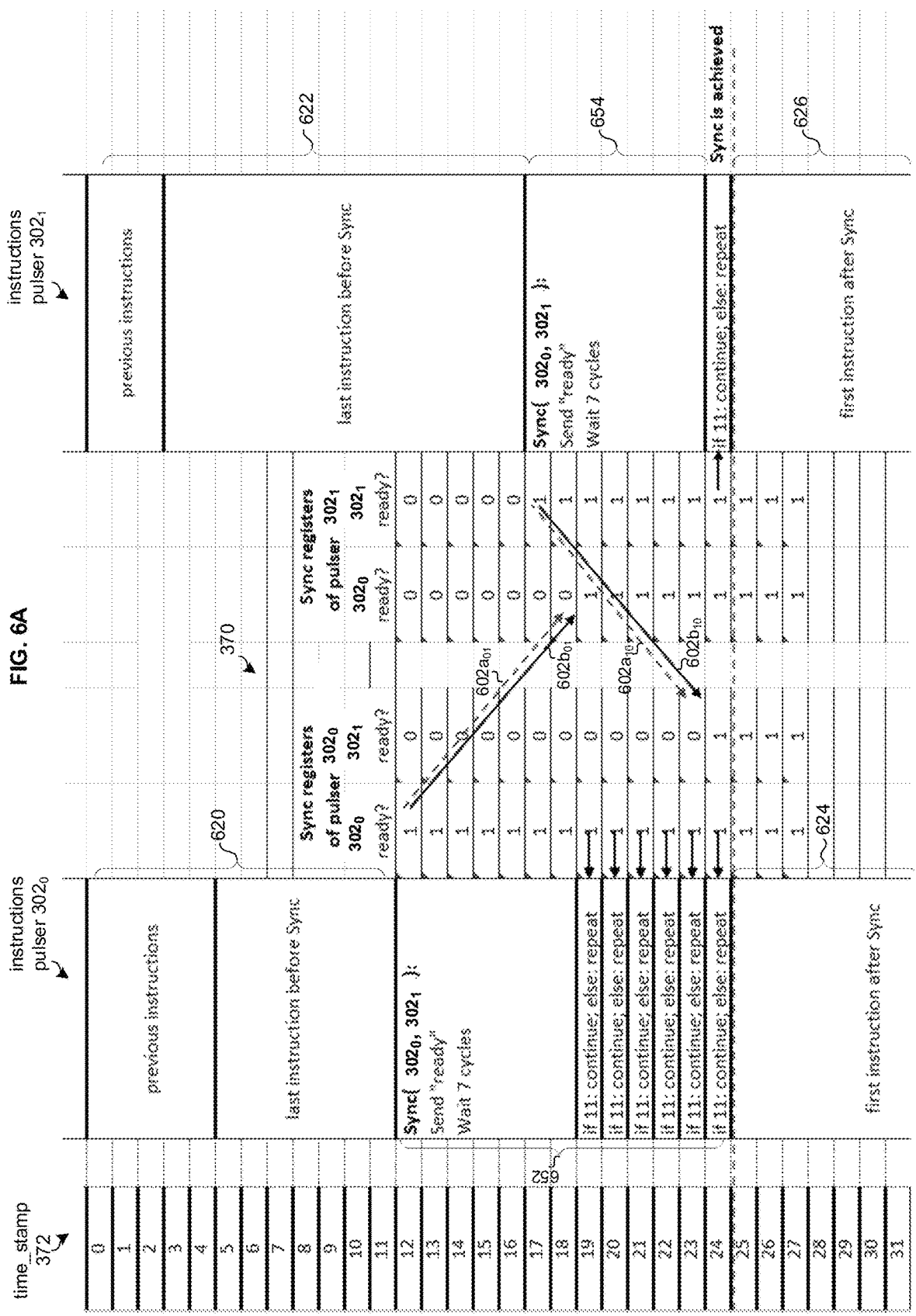

FIG. 6A illustrates synchronization in an example implementation of the quantum controller of FIG. 3A. Shown in FIG. 6A, is the value of time_stamp register 372 as time advances from the top of the figure to the bottom. It should be noted that, in the implementation of FIG. 6A, the time_stamp register 372 is not needed for synchronization, but its value is shown simply for ease of description. In other implementations, the value in the time_stamp register 372 may be used to provide a common point of reference for synchronization. In the example shown, the value of the time_stamp register 372 is incremented on each clock cycle (e.g., each positive edge of a clock signal generated by clock 378), and shows the number of clock cycles since the start of the currently-executing quantum algorithm (which, in the example shown, comprises a plurality of instruction groups executed by pulsers 302$_0$, and 302$_1$, and may comprise other instruction groups executed by others of pulsers 302$_0$-302$_{L-1}$ not shown in the figure).

Also shown in FIG. 6A are example instructions executed by pulser 302$_0$ during the depicted timeframe, and example instructions executed by pulser 302$_1$ during the depicted timeframe.

From time_stamp=0 to time_stamp=11, pulser 302$_0$ is executing instruction group 620. In the last instruction of instruction group 620, or in the first instruction immediately after instruction group 620, a sync command is present (e.g. by asserting the sync field 450$_2$ of instruction 448), indicating that a next instruction group to be executed by pulser 302$_0$ is to be executed synchronously with execution of instructions by one or more others of pulsers 302$_0$-302$_{L-1}$. In case more than two of pulsers 302$_0$-302$_{L-1}$ are present, the sync instruction may also specify which of pulsers 302$_0$-302$_{L-1}$ are to begin synchronous operation with the execution of the next instruction (e.g. by the value of the pulsers-to-sync field 450$_3$ of instruction 448). Thus, at time_stamp=12, the pulser 302$_0$ begins executing a sync procedure 652.

At the beginning of the sync procedure 652, at time_stamp=12, the pulser $302_0$ indicates that it is ready to begin a synchronous operation by sending a sync signal to pulser $302_1$, as indicated by arrows $602a_{01}$ and $602b_{01}$, and by setting its "ready" bit in its own sync registers 370.

In the example implementation of FIG. 6A, the time $t_{signal,01}$, that it takes the sync signal sent from pulser $302_0$ to reach pulser $302_1$ and the uncertainty $dt_{signal,01}$ in this time (represented as the difference in arrival time of arrow $602a_{01}$ and $602b_{01}$) are such that the sync signal reaches pulser $302_1$ during the $7^{th}$ clock cycle of the sync procedure so that on the rising clock edge between time_stamp=18 and time_stamp=19 the sync registers 370 of pulser $302_1$ change to indicate that pulser $302_0$ has reached the sync procedure. The uncertainty $dt_{signal,01}$ is small enough to assure (with some desired probability) that the sync registers 370 of pulser $302_1$ change only on this rising clock edge and not on an earlier or later rising clock edge.

On the $8^{th}$ clock cycle of the sync procedure, i.e. at time_stamp=19, pulser $302_0$ checks its sync registers 370 to determine if the required pulser(s) (i.e., the one or more of pullers $302_1$-$302_{L-1}$ with which the pulser $302_0$ is to operate synchronously for instruction group 624—pulser $302_1$ in the example shown) have reached the synchronization procedure and are ready to continue.

If the required pulser $302_1$ has reached the synchronization procedure, then on the next clock cycle pulser $302_0$ starts to execute instruction group 624. If pulser $302_1$ has not reached the synchronization procedure, pulser $302_0$ starts another check of the sync registers 370 on the next clock cycle. This process repeats, until the sync registers 370 indicates that pulser $302_1$ has reached the synchronization procedure. On the next clock cycle after the register 370 indicates pulser $302_1$ is in the sync procedure, pulser $302_0$ starts to execute instruction group 624.

Meanwhile, at time_stamp=17 pulser $302_1$ begins executing its own sync procedure 654. At time_stamp=17 pulser $302_1$ indicates that it is ready to begin a synchronous operation by sending a sync signal to pulser $302_0$ and by setting its "ready" bit in its sync registers, as indicated by arrows $602a_{10}$ and $602b_{10}$.

In the example implementation of FIG. 6A, the time $t_{signal,10}$, that it takes the sync signal sent from pulser $302_1$ to reach pulser $302_0$ and the uncertainty $dt_{signal,10}$ in this time (represented as the difference in arrival time of arrow $602a_{10}$ and $602b_{10}$) are such that the sync signal reaches pulser $302_0$ during the $7^{th}$ clock cycle of the sync procedure so that on the rising clock edge between time_stamp=23 and time_stamp=24 the sync registers of pulser $302_0$ change to indicate that pulser $302_1$ has reached the sync procedure. The uncertainty $dt_{signal,10}$ is small enough to assure (with desired probability) that the sync registers 370 of pulser $302_0$ change only on this rising clock edge and not on an earlier or later rising clock edge.

On the $8^{th}$ clock cycle of the sync procedure, i.e. at time_stamp=24, pulser $302_1$ checks its sync registers 370 to determine if the required pulser(s) have reached the synchronization procedure. In the example shown in FIG. 6A the only pulser required is pulser $302_0$, but in other cases more than two of pulsers $302_0$, $302_2$-$302_{L-1}$ can be required to be synchronized.

If pulser $302_0$ has reached the synchronization procedure, then pulser $302_1$ starts to execute instruction group 626 on the next clock cycle. If pulser $302_0$ has not reached the synchronization procedure, pulser $302_1$ repeats checking its sync registers 370 on the next clock cycle. This process repeats, until the sync register 370 indicates pulser $302_0$ has reached the synchronization procedure. On the next clock cycle after the register 370 indicates pulser $302_0$ is in the sync procedure, pulser $302_1$ starts to execute instruction group 626.

Therefore, as can be seen in the figure, pulsers $302_0$ and $302_1$ exit sync procedures 652 and 654 on the same time_stamp, namely at time_stamp=24 and thus start to execute instruction groups 624 and 626 simultaneously on the clock edge that starts time_stamp=25.

Note that even though the sync registers 370 of pulser $302_1$ indicate that both pulsers $302_0$ and $302_1$ are ready at an earlier time (at time_stamp=19), pulser $302_1$ does not check the sync registers (or does not take action based on the content of its synch registers) until time_stamp=24. In the example shown, this prevents the situation that pulser $302_1$ continues to execute instruction group 626 too early, before pulser $302_0$ continues to execute instruction group 624.

Note also that the particular time $t_{signal,ij}$ that it takes the sync signals to be sent from one pulser $302_i$ to another is not important, just that these times are known (to the desired probability) in advance and that the time that each pulser starts to check it sync registers (i.e., the "wait" time of 7 cycles in sync procedures 652 and 654) is set accordingly. Moreover, if there are more than two pulsers and the times $t_{signal,ij}$ are different for each different pair of pulsers, these times can be deliberately modified in advance or dynamically to be equal to each other. For example, in the example implementations of FIGS. 6A and 6B (discussed below), a shorter wait time may be used when the time for signals to travel between to-be-synchronized pulsers is shorter (e.g., because the pulsers reside within the same enclosure, on the same printed circuit board, and/or on the same chip), and a longer wait time may be used when the time for signals to travel between to-be-synchronized pulsers is longer (e.g., because they reside in different enclosures, on different printed circuit boards, and/or on different chips). Similarly, for the example implementations of FIGS. 7A-7C (described below), a shorter wait time may be used when the time for signals to travel between the sync manager and one or more of the to-be-synchronized pulsers is shorter, and a longer wait time may be used when the time for signals to travel between the sync manager and one or more of the to-be-synchronized pulsers is longer.

Figure 6B:
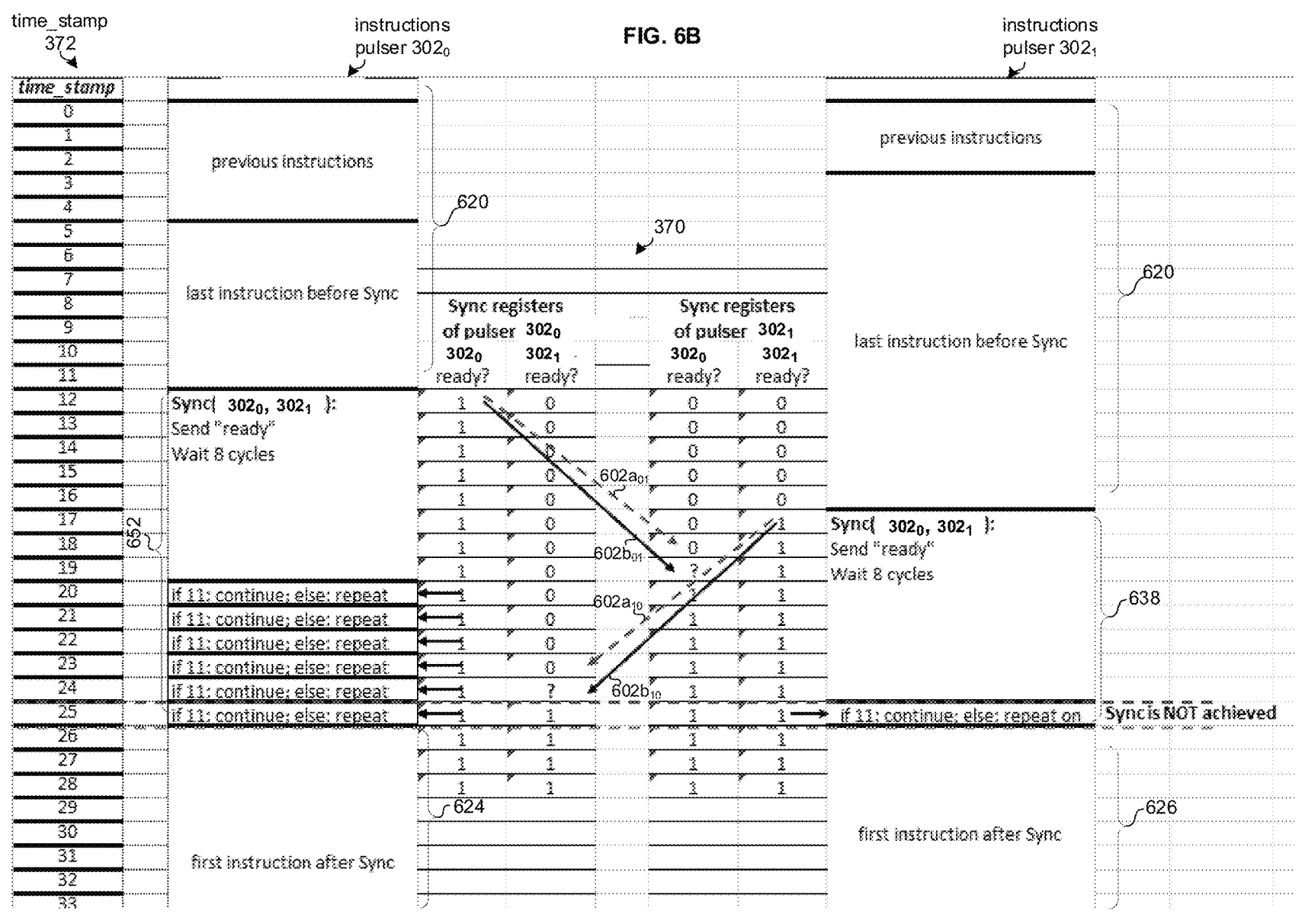

FIG. 6B illustrates the same sync method as FIG. 6A, but shows how it may be unreliable when the uncertainty in the time it takes the sync signal to get from pulser $302_0$ to pulser $302_1$ (denoted $dt_{signal,01}$ and represented as the difference in arrival time of arrow $602a_{01}$ and $602b_{01}$) and/or the uncertainty in the time it takes the sync signal to get from pulser $302_1$ to pulser $302_0$ (denoted $dt_{signal,10}$ and represented as the difference in arrival time of arrow $602a_{10}$ and $602b_{10}$) may be larger than 1 clock cycle. In FIG. 6B, as in FIG. 6A, both pulsers $302_0$ and $302_1$ send the sync signals to each other at time_stamp=12 and time_stamp=17, respectively. In the example implementation, the time that each pulser waits before checking for the first time its respective sync registers is increased now to 8 cycles (so that it is larger than the largest time it takes the pulsers to share their status). However, as shown in the figure, due to the possible uncertainty $dt_{signal,10}$, which is larger than 1 clock cycle in this example implementation, it is not possible to determine in advance whether pulser $302_0$ will go out from the sync procedure at time_stamp=24 or time_stamp=25. Thus, it is not possible to determine after how many clock cycles pulser $302_1$ should check its sync registers for the first time in order to go out from the sync procedure together with pulser $302_0$. Therefore, synchronization to within a single clock cycle accuracy cannot be achieved with this method.

Figure 7A:
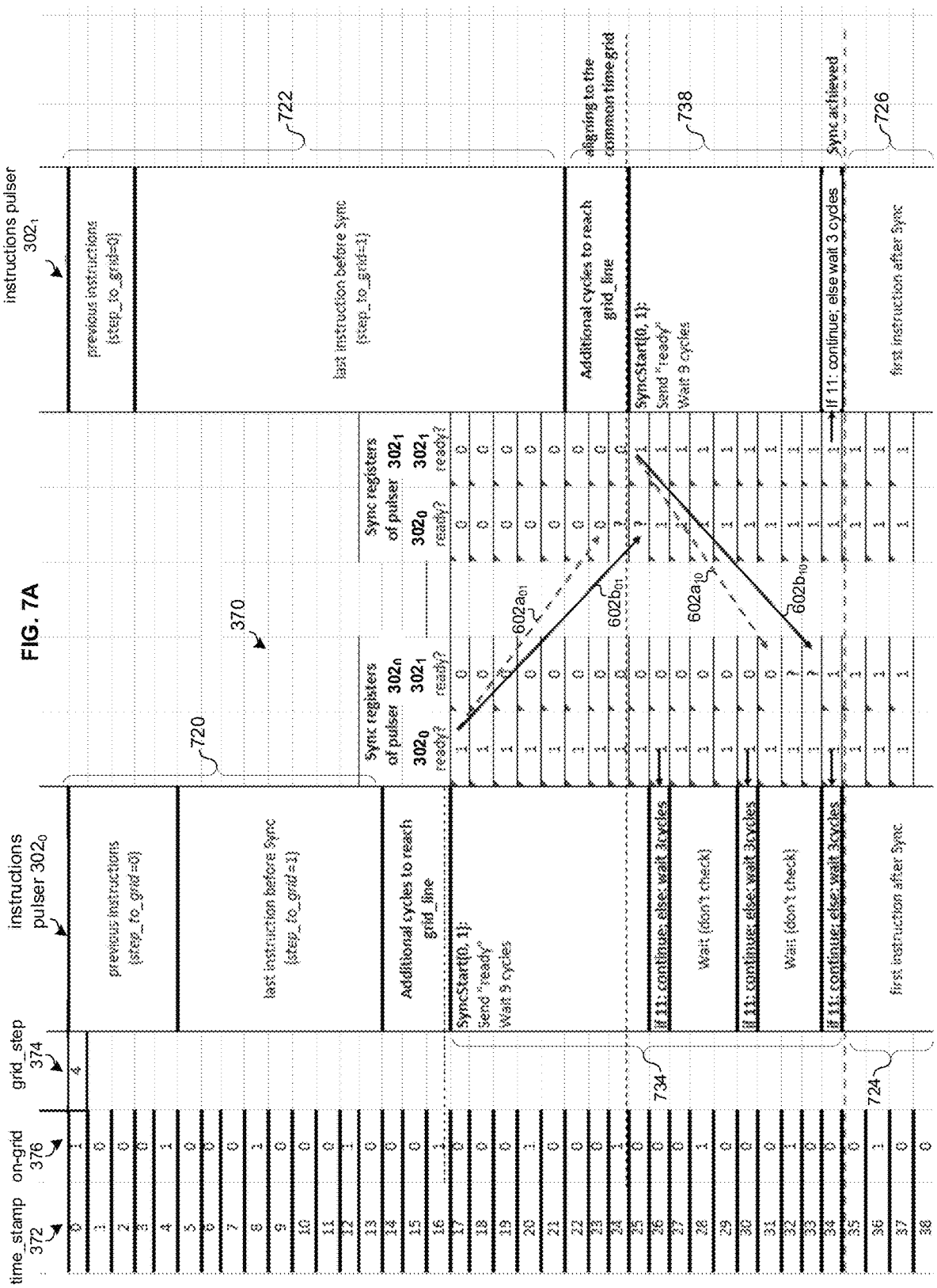

FIG. 7A illustrates synchronization in an example implementation of the quantum controller of FIG. 3A. Shown in FIG. 7A, are the value of time_stamp register 372, the contents of the on-grid register 376, and the grid_step register 374 as time advances from the top of the figure to the bottom. As in FIGS. 6A and 6B, the time_stamp register 372 is not actually needed in the implementations of FIGS. 7A-7C, but is shown simply for clarity of description. In other implementations, the value in the time_stamp register 372 may be used as a common reference point for synchronization. Also shown are example instructions executed by pulser $302_0$ during the depicted timeframe, and example instructions executed by pulser $302_1$ during the depicted timeframe.

In the example shown, grid_step register 374 is set to 4, such that every $4^{th}$ clock cycle is an on_grid cycle. Thus, every $4^{th}$ clock cycle the value of on-grid register 376 is asserted (asserted=1 in the example shown) and then is de-asserted on the next clock cycle. The value of grid_step register 374 is chosen to be larger than the uncertainty $dt_{signal,ij}$ in the time $t_{signal,ij}$ that it takes a sync signal to be sent from any one pulser $302_i$ to any other pulser $302_j$. In an example implementation, sync procedures, described below, always begin on the next clock cycle immediately after an on_grid=1 clock cycle (which we refer to as an on-grid clock cycle below).

From time_stamp=0 to time_stamp=13, pulser $302_0$ is executing instruction group 720. In the last instruction of instruction group 720, the step_to_grid field $450_5$ is asserted, indicating that a next instruction group 724 to be executed by pulser $302_0$ is to be executed synchronously with execution of instructions by another pulser (pulser $302_1$ in the example shown). Thus, at time_stamp=13, the pulser $302_0$ begins waiting for the next on-grid clock cycle (e.g., it executes "idle" or "wait" operation), which occurs at time_stamp=16. After detecting the on-grid clock cycle at time_stamp=16, the pulser $302_0$ begins executing a sync procedure 734. Also, in case more than two of the pulsers $302_0$-$302_{L-1}$ to be synchronized, the last instruction of instruction group 720 or the first instruction immediately after, may also specify which of pulsers $302_0$-$302_{L-1}$ are to execute instructions synchronously with the execution of the instruction grouping 724 (e.g. by the value of the pulsers-to-sync field $450_3$ of instruction 448).

At the beginning of the sync procedure 734, at time_stamp=17, the pulser $302_0$ indicates that it is ready to begin a synchronous operation by sending a sync signal to pulser $302_1$, as indicated by arrows $602a_{01}$ and $602b_{01}$, and by setting its "ready" bit in its sync registers 370.

In the example implementation of FIG. 7A, the time $t_{signal,01}$ that it takes the signal sent from pulser $302_0$ to reach pulser $302_1$ and the uncertainty in this time (denoted $dt_{signal,01}$ and represented as the difference in arrival time of arrow $602a_{01}$ and $602b_{01}$) are such that the signal reaches pulser $302_1$ during the $7^{th}$, $8^{th}$ or $9^{th}$ cycles of the sync procedure so that the sync registers 370 of pulser $302_1$ change to indicate that pulser $302_0$ has reached the sync procedure on one of the rising clock edges between time_stamp=23 and time_stamp=26. The uncertainty $dt_{signal,01}$ is too large to ensure that the sync registers of pulser $302_1$ change on a deterministic clock edge, but is small enough to assure (with some desired probability) that they change on one of these three rising clock edges and not on an earlier or later rising clock edge.

At time_stamp=26 (i.e. on the $10^{th}$ clock cycle of pulser $302_0$'s sync procedure 734) pulser $302_0$ checks its sync registers to determine whether the required pulser(s) (pulser $302_1$ in the example shown) have reached the synchronization procedure and are ready to continue.

If the pulser $302_1$ has reached the synchronization, then pulser $302_0$ starts to execute an instruction group 724 on the next clock cycle. If pulser $302_1$ has not reached the synchronization procedure, pulser $302_0$ waits for the $4^{th}$ rising clock edge counted from the time stamp of the check of the sync registers 370, and then starts another check of the sync registers 370. This process repeats until pulser $302_0$'s sync registers 370 indicate that pulser $302_1$ has reached the synchronization procedure. On the next clock cycle after the register 370 indicates pulser $302_1$ is in the sync procedure, pulser $302_0$ starts to execute instruction group 724.

Meanwhile, pulser $302_1$ has completed an instruction group 722 at time_stamp=21. Since step_to_grid was asserted in the last instruction of instruction group 722, pulser $302_1$ waits for the next on-grid clock cycle, which arrives at time_stamp=24, and then begins executing sync procedure 738.

At the beginning of the sync procedure 738 (time_stamp=25), pulser $302_1$ indicates that it is ready to begin a synchronous operation by sending a sync signal to pulser $302_0$, as indicated by arrows $602a_{10}$ and $602b_{10}$, and by setting its "ready" bit in its sync registers 370.

In the example implementation of FIG. 7A, the time $(t_{signal,10})$ that it takes the signal sent from pulser $302_1$ to reach pulser $302_0$ and the uncertainty in this time (denoted $dt_{signal,10}$ and represented as the difference in arrival time of arrow $602a_{10}$ and $602b_{10}$) are such that the signal reaches pulser $302_0$ during the $7^{th}$, $8^{th}$ or $9^{th}$ cycles of the sync procedure so that on one of the rising clock edges between time_stamp=31 and time_stamp=34 the sync registers 370 of pulser $302_0$ change to indicate that pulser $302_0$ has reached the sync procedure. The uncertainty $dt_{signal,01}$ is too large to ensure that the sync registers of pulser $302_1$ change on a deterministic clock edge, but is small enough to assure that they change on one of these three rising clock edges and not on an earlier or later rising clock edge.

At time_stamp=3 (i.e. on the $10^{th}$ clock cycle of pulser $302_1$'s sync procedure 738) pulser $302_1$ checks its sync registers to determine if the required pulser(s) (pulsers $302_0$ in the example of FIG. 7A) have reached the synchronization procedure.

If pulser $302_0$ has reached the synchronization procedure, then pulser $302_1$ starts to execute instruction group 726 on the next clock cycle. If pulser $302_0$ has not reached the synchronization procedure, pulser $302_1$ waits for the $4^{th}$ rising clock edge counted from the time stamp of the check of the sync registers 370, and then starts another check of the sync registers 370. This process repeats, until the sync registers 370 of pulser $302_1$ indicate that pulser $302_0$ has reached the synchronization procedure, in which case pulser $302_1$ starts to execute instruction group 726 on the next clock cycle.

Therefore, as can be seen in the figure, pulsers $302_0$ and $302_1$ decide to go out of the sync procedure on the same time_stamp (time_stamp=34) and thus start to execute instruction groups 724 and 726 simultaneously on the clock edge that starts time_stamp=35.

Note that even though the sync registers 370 of pulser $302_1$ indicate that both pulsers $302_0$ and $302_1$ are ready at an earlier time, possibly as early as time_stamp=24, pulser $302_1$ does not check its sync registers 370 (or does not take action based on the content of its synch register 370) until time_stamp=34.

Note also that even though the sync registers 370 of pulser $302_0$ may indicate that both pulsers $302_0$ and $302_1$ are ready at an earlier time (as early as time_stamp=32), pulser $302_0$ checks its sync registers 370 at time_stamp=30 and then does not check them again (or does not take action based on them) until time_stamp=34, thus avoiding taking any action based on contents of the sync registers 370 at these uncertain times.

Note also that the particular amount of time $t_{signal,ij}$ that it takes each sync signal to be sent from one pulser $302_i$ to another pulser $302_j$ is not important, just that these times are known (to the desired probability) in advance and that the time that each pulser starts to check it sync registers 370 is set accordingly. Moreover, if there are more than two pulsers to be synchronized and the times $t_{signal,ij}$ are different for each different pair of pulsers, these times can be deliberately modified, in advance or dynamically, to be equal to each other.

Note also that the particular uncertainty $dt_{signal,ij}$ in the time that it takes each sync signal to be sent from one pulser $302_i$ to another pulser $302_j$ is not important, just that this uncertainty is known (to the desired probability) in advance. Moreover, if there are more than two pulsers to be synchronized and the uncertainties $dt_{signal,ij}$ are different for each different pair of pulsers, these uncertainties can be deliberately modified, in advance or dynamically, to be equal to each other.

By setting the grid_step to be larger than the uncertainty $dt_{signal,ij}$ in the time $t_{signal,ij}$ that it takes a sync signal to be sent from any one pulser $302_i$ to any other pulser $302_j$, synchronization with a single clock cycle accuracy is achieved.

Figure 7B:
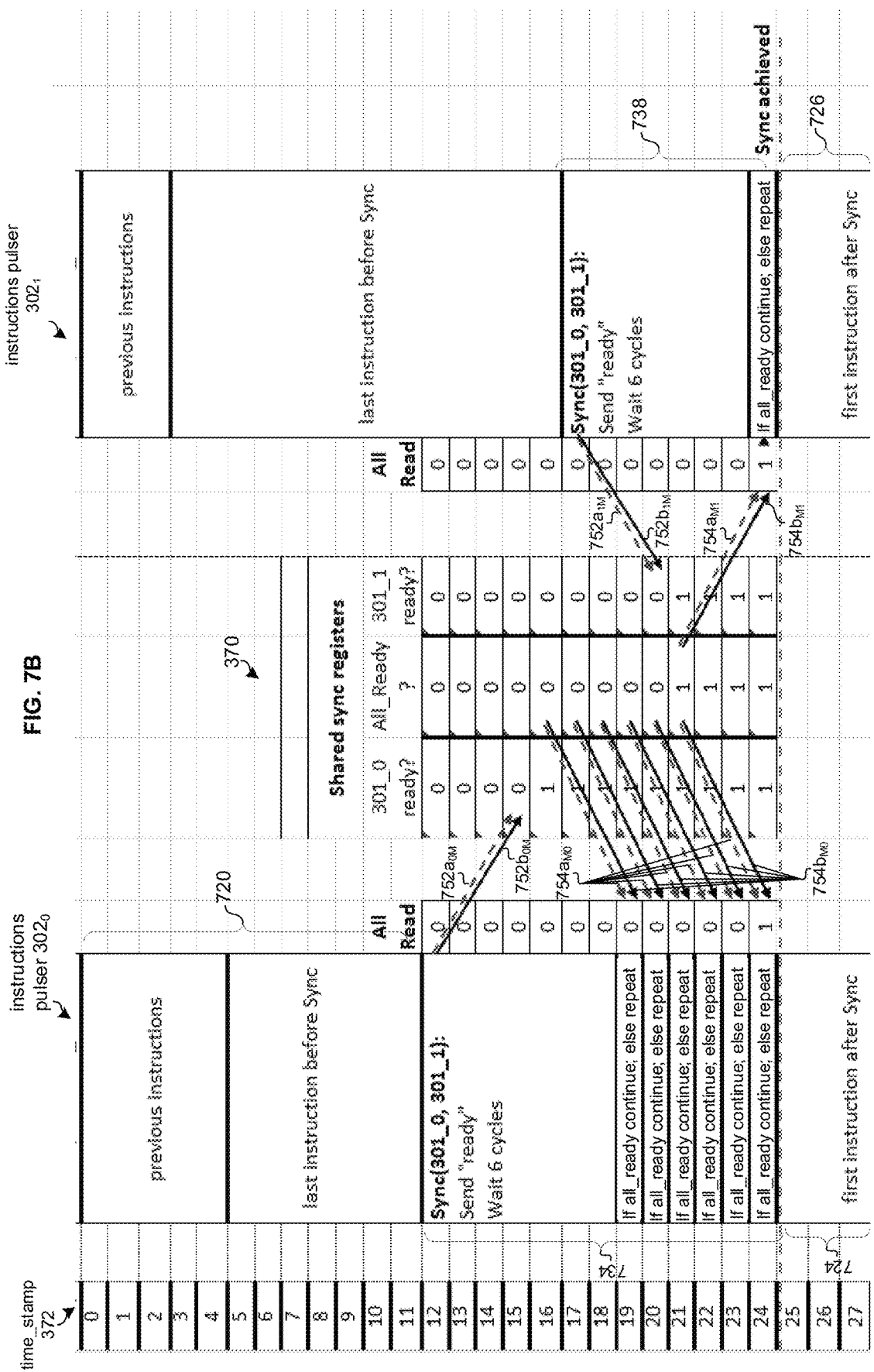

FIG. 7B illustrates synchronization in an example implementation of the quantum controller of FIG. 3A. The figure demonstrates synchronization methods similar to that described above for FIG. 6A, but instead of each of pulsers $302_0$-$302_{L-1}$ having its own sync registers 370, there is a sync manager 366 that holds shared sync registers 370 for all pulsers $302_0$-$302_{L-1}$.

In the example implementation of FIG. 7B, pulsers $302_0$ and $302_1$ start the synchronization procedures 734 and 738 at time_stamp=11 and time_stamp=16 respectively, similar to the implementation described for FIG. 6A. However, when each pulser $302_0$ and $302_1$ starts a sync procedure, instead of sending its sync signal to the other pulser(s) involved in the synchronization, it sends a sync signal to the sync manager 366 (shown as arrows $752a_{0M}$ and $752b_{0M}$, and $752a_{1M}$ and $752a_{1M}$). The sync signal reaches the sync manager 366 some time $t_{plsr\_mgr} \pm dt_{plsr\_mgr}$ after it is sent and changes the shared sync registers 370 to indicate that the pulser that sent it is ready to begin synchronous operation.

In the example implementation shown, the sync manager 366 checks the shared sync registers 370 every clock cycle and sends an All_Ready signal to all pulsers that are required to be synchronized indicating whether all the desired pulsers (pulsers $302_0$ and $302_1$ in the example implementation shown in FIG. 7B) are ready to begin a synchronous operation or not. The All_Ready signal 754 reaches each of the relevant pulsers $302_j$ some time $t_{mgr\_plsr,j} \pm dt_{mgr\_plsr,j}$ later (where $dt_{mgr\_plsr,j}$ is the uncertainty in the time it takes the All_Ready signal $754_{Mj}$ to be sent from the sync manager 366 to pulser $302_j$, and is represented as the difference in arrival times of two corresponding arrows $754a_{Mj}$ and $754b_{MJ}$).

In the example implementations of FIG. 7B, the times $t_{plsr\_mgr}$ and $t_{mgr\_plsr}$ and the uncertainties $dt_{plsr\_mgr}$ and $dt_{mgr\_plsr}$ in these times, as well as the time that it takes the sync manager 366 to calculate the All_Ready signal 754 from shared sync registers 370 (1 clock cycle in the example implementation shown in FIG. 7B) are such that the All_Ready signal 754 that reaches each pulser can be asserted (change to 1) only (in the example implementation shown in FIG. 7B) between the $7^{th}$ clock cycle and the $8^{th}$ clock cycle of the sync procedure that caused the All_ready signal to change (i.e. the sync procedure of the last pulser to be synchronized that reached a sync procedure).

Each pulser of the pulsers required to be synchronized ($302_0$ and $302_1$ in the example of FIG. 7B), checks the All_Ready signal 754 received from the sync manager on the $8^{th}$ clock cycle of its synchronization procedure and continues to check the All_Ready signal 754 every clock cycle after that until All_Ready=1. Once the All-Ready signal 754 is asserted, the pulsers can begin, on the next clock cycle, executing the next instruction that are to be executed synchronously. Since there is a deterministic number of cycles from the cycle in which the All_Ready signal 754 of the sync manager 366 is asserted to the cycle in which all pulsers receive this signal, synchronization is achieved.

Figure 7C:
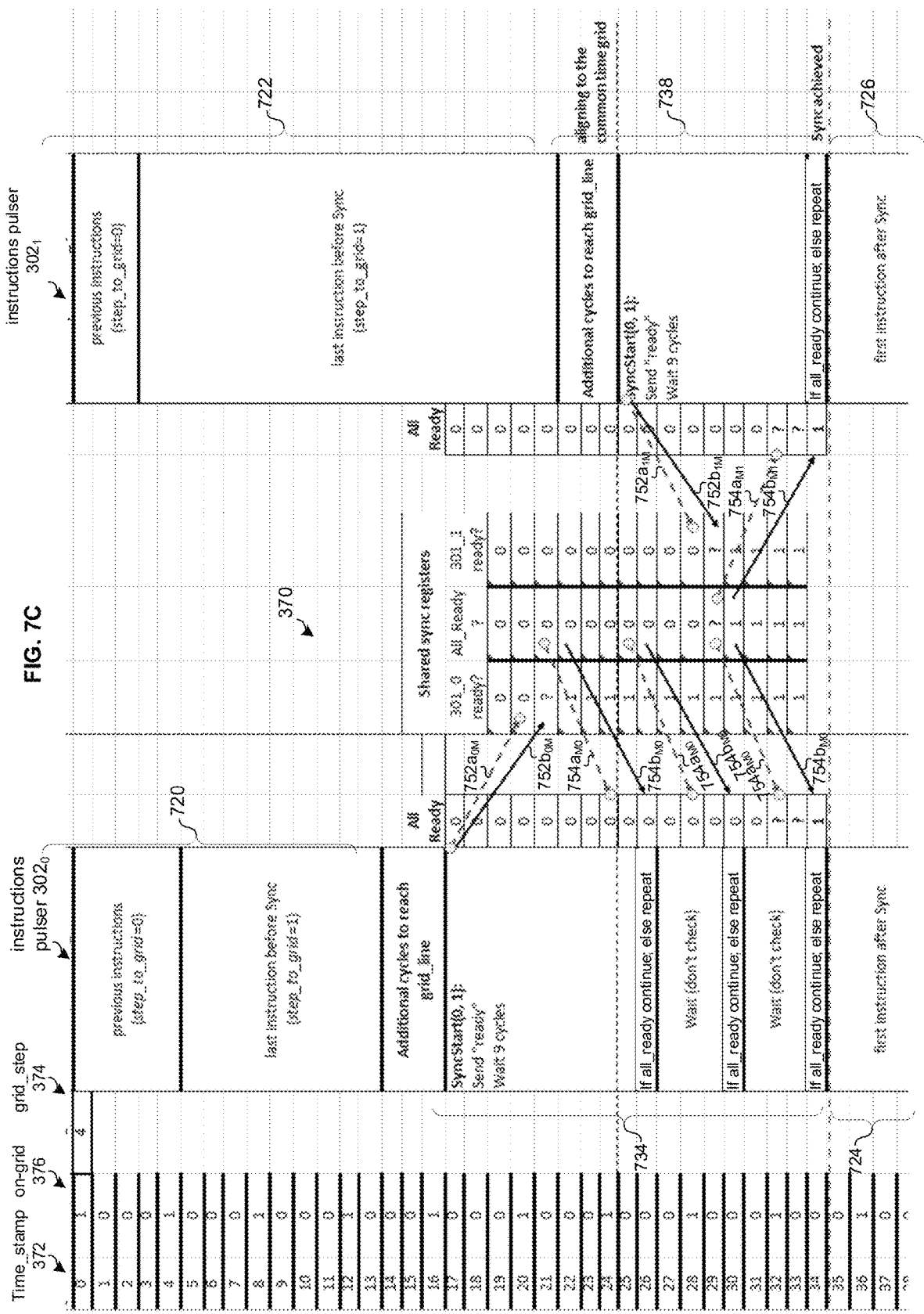

FIG. 7C illustrates synchronization in an example implementation of the quantum controller of FIG. 3A. The figure demonstrates synchronization methods similar to that described above for FIG. 6A, but instead of each pulser $302_j$ having its own sync registers 370, there is a sync manager 366 that holds shared sync registers 370 for all pulsers $302_0$-$302_{L-1}$.

In the example implementations of FIG. 7C, pulsers $302_0$ and $302_1$ start the synchronization procedures at time_stamp=16 and time_stamp=24, respectively, after waiting for an on-grid time stamp, similar to the implementation described for FIG. 7A. However, when each pulser $302_l$ starts a sync procedure, instead of sending its sync signal to all other pulsers involved in the synchronization, it sends a sync signal 752 to the sync manager 366. The sync signal from each pulser $302_l$ reaches the sync manager some time $t_{plsr_{mgr}}{}^{,l} \pm dt_{plsr\_mgr,l}$ after it is sent and changes the shared sync registers 370 to indicate that pulser $302_l$ is ready to begin synchronous operation.

In the example implementations, the sync manager 366 checks the shared sync registers 370 every clock cycle and sends an All_Ready signal 754 to all pulsers that are required to be synchronized. The All_Ready signal 754 indicates whether all the desired pulsers (pulsers $302_0$ and $302_1$ in the example implementation of FIG. 7C) are ready to begin a synchronous operation or not. The All_Ready signal 754 reaches each of the relevant pulsers $302_l$ some time $t_{mgr_{plsr}}{}^{,l} \pm dt_{mgr_{plsr}}{}^{,l}$ later.

In the example implementations of FIG. 7C, the times $t_{plsr\_mgr,l}$ and $t_{mgr_{plsr}}{}^{,l}$, the uncertainties $dt_{plsr_{mgr}}{}^{,l}$ and $dt_{mgr_{plsr}}{}^{,l}$ in these times (corresponding to the difference in arrival times of a pair of arrows 754a and 754b), as well as the time that it takes the sync manager 366 to calculate the All_Ready signal 754 from given shared sync registers values (1 clock cycle in the example implementation), are such that, in the example implementation shown in FIG. 7C, the All_Ready signal 754 that reaches each pulser can be asserted (change to 1) only between the $7^{th}$ clock cycle and the $10^{th}$ clock cycle of the sync procedure that caused it to change (i.e. the sync procedure of the last pulser of the required pulsers that reached a sync procedure).

In the example shown in FIG. 7C, each of pulsers $302_0$ and $302_1$ checks the All_Ready signal 754 received from the sync manager 366 on the 10$^{th}$ clock cycle of its synchronization procedure and continues to check the All_Ready signal 754 every 4 clock cycles (the number of clock cycles that is equal to the value stored in the time_grid_step register 374) from then on until All_Ready=1. Once All_Ready=1, the pulser moves, on the next clock cycle, to execute the next instruction that is to be executed synchronously. The value of the grid_step register 374 is chosen so that the value of the All_Ready signal 754 that reaches each pulser can change only between two checking cycles (i.e. a cycle in which pulser/s check the value of All_Ready), thus the values of these signals at the checking cycles are deterministic. Hence, all pulsers see the All_Ready signal asserted at the same checking cycle and synchronization is achieved.

Note that the particular values of $t_{plsr_{mgr}}^{\;\;\;\;,l}$, $t_{mgr_{plsr}}^{\;\;\;\;,l}$, $dt_{plsr_{mgr}}^{\;\;\;\;,l}$, and $dt_{mgr_{plsr}}^{\;\;\;\;l}$ are not important. What matters is that these values are known (to a desired probability) in advance. These values were chosen to be the same in FIGS. 7A, 7B, and 7C for aid of illustration, but in practice the values can be anything.

The sync manager 366 in the example implementations of FIGS. 7B and 7C can be advantageous in cases where more than two of the pulsers $302_0$-$302_{L-1}$ are to be synchronized, since each pulser $302_l$ only needs to send and receives a single signal (a sync signal and All_Ready signal) and only needs a single circuit for performing calculations to determine whether all relevant pulsers are ready. This is in contrast to the case where each of the pulsers $302_0$-$302_{L-1}$ has its own sync registers 370 and thus each of the pulsers $302_0$-$302_{L-1}$ must receive sync signals from all others of the pulsers $302_0$-$302_{L-1}$ and perform calculations on its own to determine whether all to-be-synchronized pulsers are ready, which may require, for example, higher overheads in wiring and computational power.

The sync manager 366 in the example implementations of FIGS. 7B and 7C may be configured to autonomously determine which pulsers $302_0$-$302_{L-1}$ are to be synchronized at each point in time during the execution of a quantum algorithm by the quantum controller, or may receive this information from another circuit of the quantum controller.

In accordance with an example implementation of this disclosure, a quantum controller (e.g., 210) comprises a first quantum control pulse generation circuit (e.g., pulser $302_0$), a second quantum control pulse generation circuit (e.g., pulser $302_1$), and synchronization circuitry (e.g., one or more of 370, 374, 376, and 378). The synchronization circuitry is operable to determine (e.g., via values stored in one or more registers) a sequence of on-grid times that occur periodically with a period that, to a determined probability, is larger than an uncertainty in synchronization signal propagation time for the first quantum control pulse generation circuit and the second quantum control pulse generation circuit, where the synchronization signal propagation time for the first quantum control pulse generation circuit and the second quantum control pulse generation circuit is: the time required for one of the first quantum control pulse generation circuit and the second quantum control pulse generation circuit to generate a synchronization signal, plus the time required for the synchronization signal to travel from one of the first quantum control pulse generation circuit and the second quantum control pulse generation circuit to the other, plus the time for the other to receive the signal and extract the information in the signal. The first quantum control pulse generation circuit is operable to determine, during execution of a first instruction group (e.g, 620 or 720), that the first quantum control pulse generation circuit is to next execute a third instruction group (e.g., 624 or 724) synchronously with execution of a second instruction group (e.g., 626 or 726) by the second quantum control pulse generation circuit. The first quantum control pulse generation circuit is operable to: upon completion of the execution of the first instruction group, wait for a next one of the on-grid times; upon arrival of the next one of the on-grid times, execute a synchronization procedure (e.g., 652 or 734). The synchronization procedure comprises generation of a synchronization signal (e.g., $602a_{01}$) that indicates that the first quantum control pulse generation circuit has started the synchronization procedure; a check, after a wait period, of whether the second quantum control pulse generation circuit is in the synchronization procedure, wherein the wait period is greater, to a determined probability, than the synchronization signal propagation time; if the check reveals that the second quantum control pulse generation circuit is in the synchronization procedure, a start of execution of the third instruction group on a subsequent, determined time; and if the check reveals that the second quantum control pulse generation circuit is not in the synchronization procedure, another check of whether the second quantum control pulse generation circuit is in the synchronization procedure after a period of time equal to the period of the on-grid times. The quantum controller may comprise a clock circuit (e.g., 378). The period of the on-grid times may be one cycle of the clock circuit. The period of the on-grid times may be multiple cycles of the clock circuit. The number of cycles of the clock circuit that correspond to the period of the on-grid times may be stored in a grid step register (e.g., 374) of the synchronization circuitry. The plurality of quantum control pulse generation circuits may comprise three or more quantum control pulse generation circuits (e.g., $302_0$, $302_1$, and $302_2$). The synchronization circuitry may be operable to adjust the value stored in the grid step register as well as the initial wait period based on which two of the three quantum control pulse generation circuits are the first and the second of the plurality of quantum control pulse generation circuits. The check of whether the second of the plurality of quantum control pulse generation circuits is in the synchronization procedure may comprise a check of a state of a synchronization register (e.g., 370) of the synchronization circuitry. The determination that the first of the plurality of quantum control pulse generation circuits is to next execute a third instruction group synchronously with execution of a second instruction group by the second of the plurality of quantum control pulse generation circuits may comprise a detection of an asserted synchronization field (e.g., $450_2$) in an instruction received by the first quantum control pulse generation circuit. The first of the plurality of quantum control pulse generation circuits may comprise a synchronization register (e.g., 370) and the check of whether the second of the plurality of quantum control pulse generation circuits is in the synchronization procedure may comprise a read of a state of the synchronization register. The plurality of quantum control pulse generation circuits may comprise three or more quantum control pulse generation circuits and the first of the plurality of quantum control pulse generation circuits may be operable to determine which of the other of three or more quantum control pulse generation circuits is the second of the plurality of quantum control pulse generation circuits to be synchronized with the first of the plurality of quantum control pulse generation circuits. The determination of which of the at least three quantum control pulse generation circuits is the second of the plurality of quantum control pulse generation circuits to be synchronized with the first of the plurality of quantum control pulse generation circuits may be based on a pullers-to-sync field (e.g., $450_3$) of an instruction received by the first of the plurality of quantum control pulse generation circuits. The quantum controller may comprise a synchronization manager circuit (e.g., 366), and the synchronization manager may comprises circuitry (e.g., 370) configured to indicate which of the at least three quantum control pulse generation circuits is the second quantum control pulse generation circuit to be synchronized with the first of the plurality of quantum control pulse generation circuits. The circuitry configured to indicate which of the at least three quantum control pulse generation circuits is the second quantum control pulse generation circuit to be synchronized with the first of the plurality of quantum control pulse generation circuits may comprise pullers-to-sync registers (e.g., part of registers 370), and a state of the synchronization registers may indicate which of the three or more quantum control pulse generation circuits is the second quantum control pulse generation circuit to be synchronized with the first of the plurality of quantum control pulse generation circuits. The synchronization manager circuit may be operable to generate a ready signal (e.g. 754a) that indicates whether the first of the plurality of quantum control pulse generation circuits and the second of the plurality of quantum control pulse generation circuits are ready to begin executing instructions synchronously with one another. The check of whether the second of the plurality of quantum control pulse generation circuit is in the synchronization procedure may comprise a check of the state of the ready signal.

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
a first pulse generation circuit, a second pulse generation circuit, and synchronization management circuitry, wherein:
the first pulse generation circuit and second pulse generation circuit are configured to sometimes generate pulses asynchronously with respect to each other and sometimes generate pulses synchronously with respect to each other; and
the first pulse generation circuit and the second pulse generation circuit are each configured to determine when to generate pulses synchronously based on the synchronization management circuitry.

2. The system of claim 1, wherein the first pulse generation circuit and the second pulse generation circuit are each configured to determine when to generate pulses synchronously based a state of a synchronization register of the synchronization management circuitry.

3. The system of claim 1, wherein each of the first pulse generation circuit and the second pulse generation circuit is operable to, when ready to begin synchronous operation:
trigger a change of state of the synchronization management circuitry;
read a state of the synchronization management circuitry; and
wait to begin synchronous operation until the state of the synchronization management circuitry indicates both the first pulse generation circuit and the second pulse generation circuit are ready to begin synchronous operation.

4. The system of claim 3, wherein:
the synchronization management circuitry comprises a grid-step register; and
each of the first pulse generation circuit and the second pulse generation circuit is operable to, when the state of the synchronization management circuitry indicates that the first pulse generation circuit and the second pulse generation circuit are not both ready to begin synchronous operation, wait for a number of clock cycles determined based on a value stored in the grid-step register.

5. The system of claim 4, wherein the synchronization management circuitry is operable to set the value stored in the grid-step register based on an uncertainty in how long it takes signals to propagate between the synchronization management circuitry and the first pulse generation circuit and/or between the synchronization management circuitry and the second pulse generation circuit.

6. The system of claim 3, wherein each of the first pulse generation circuit and the second pulse generation circuit is operable to, when ready to begin synchronous operation, wait for a next on-grid clock cycle before the trigger of the change of state of the synchronization management circuitry.

7. The system of claim 6, wherein on-grid clock cycles occur 1 out of every N clock cycles.

8. The system of claim 7, wherein the synchronization management circuitry comprises an on-grid register that is in a first state for 1 out of every N clock cycles and is not in the first state for N-1 of every N clock cycles, wherein:
    N is an integer; and
    the next on-grid clock cycle is a next clock cycle in which the on-grid register is in the first state.

9. The system of claim 8, wherein a value of N is determined based on a value stored in a grid-step register of the synchronization management circuitry.

10. The system of claim 1, wherein the synchronization management circuitry comprises a wait time register.

11. The system of claim 10, wherein the synchronization management circuitry is operable to set a value stored in the wait time register based on how long it takes signals to propagate between the synchronization management circuitry and the first pulse generation circuit and/or between the synchronization management circuitry and the second pulse generation circuit.

12. The system of claim 1, wherein the first pulse generation circuit is operable to:
    in response to detection of a particular value in a synchronization field of an instruction, trigger a change of state of the synchronization management circuitry;
    after the trigger of the change of state, read the state of the synchronization management circuitry to determine whether the second pulse generation circuit is ready to begin synchronized pulse generation;
    if the read state of the synchronization management circuitry indicates that the second pulse generation circuit is ready to begin synchronized pulse generation, begin synchronized pulse generation; and
    if the read state of the synchronization management circuitry indicates that the second pulse generation circuit is not ready to begin synchronized pulse generation, wait to begin synchronized pulse generation at a later time.

13. The system of claim 12, comprising a grid-step register, wherein if the read state of the synchronization management circuitry indicates that the second pulse generation circuit is not ready to begin synchronous operation with the first pulse generation circuit, the wait is for a number of clock cycles determined based on a grid-step register.

14. The system of claim 13, wherein a value stored in the grid-step register is based on an uncertainty in how long it takes signals to propagate between the synchronization management circuitry and the second pulse generation circuit and/or between the synchronization management circuitry and the first pulse generation circuit.

15. The system of claim 12, wherein the first pulse generation circuit is operable to, in response to detection of a particular value in the synchronization field, wait for a next on-grid clock cycle before the trigger of the change of state of the synchronization management circuitry.

16. The system of claim 15, comprising an on-grid register that is in a first state for 1 out of every N clock cycles and is not in the first state for N-1 of every N clock cycles, where:
    N is an integer; and
    the next on-grid clock cycle is a next clock cycle in which the on-grid register is in the first state.

17. The system of claim 16, wherein a value of N is determined based on a value stored in a grid-step register.

18. The system of claim 12, comprising one or more third pulse generation circuits.

19. The system of claim 18, wherein:
    the instruction comprises a field containing a bitmap;
    each bit of the bitmap corresponds to a respective one of the first pulse generation circuit, the second pulse generation circuit, and the one or more third pulse generation circuits; and
    the bitmap indicates which of the first pulse generation circuit, the second pulse generation circuit, and the one or more third pulse generation circuits are to operate synchronously.

* * * * *